(12) United States Patent
Sue et al.

(10) Patent No.: US 11,798,940 B2
(45) Date of Patent: Oct. 24, 2023

(54) SEMICONDUCTOR DEVICE

(71) Applicant: TAIWAN SEMICONDUCTOR MANUFACTURING CO., LTD., Hsinchu (TW)

(72) Inventors: Pin-Dai Sue, Tainan (TW); Tzung-Yo Hung, Chiayi County (TW); Jung-Hsuan Chen, Hsinchu (TW); Ting-Wei Chiang, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 207 days.

(21) Appl. No.: 16/897,167

(22) Filed: Jun. 9, 2020

(65) Prior Publication Data

US 2020/0411516 A1 Dec. 31, 2020

Related U.S. Application Data

(60) Provisional application No. 62/867,831, filed on Jun. 27, 2019.

(51) Int. Cl.
*H01L 21/8238* (2006.01)
*H01L 27/088* (2006.01)
*H01L 23/528* (2006.01)
*H01L 21/822* (2006.01)
*H01L 21/8234* (2006.01)
*H01L 29/66* (2006.01)

(52) U.S. Cl.
CPC ...... *H01L 27/0886* (2013.01); *H01L 21/8221* (2013.01); *H01L 21/823431* (2013.01); *H01L 21/823437* (2013.01); *H01L 21/823475* (2013.01); *H01L 23/528* (2013.01); *H01L 29/66545* (2013.01)

(58) Field of Classification Search
None
See application file for complete search history.

(56) References Cited

U.S. PATENT DOCUMENTS

| | | | | |
|---|---|---|---|---|
| 10,192,867 B1* | 1/2019 | Frougier | ......... | H01L 21/823864 |
| 2005/0001271 A1* | 1/2005 | Kobayashi | ........ | H01L 27/11807 257/202 |
| 2020/0135735 A1* | 4/2020 | Sengupta | .......... | H01L 29/66795 |

* cited by examiner

*Primary Examiner* — Joseph C. Nicely
*Assistant Examiner* — Lamont B Koo
(74) *Attorney, Agent, or Firm* — Maschoff Brennan

(57) ABSTRACT

A semiconductor device includes a first transistor disposed over a substrate, a second disposed over the first transistor, and a conductive trace. The first transistor includes a first active area extending on a first layer. The second transistor includes a second active area extending on a second layer above the first layer. The conductive trace extends on a third layer. The first to third layers are separated from each other in a first direction, and the third layer is interposed between the first and second layers. The first active area, the second active area, and the conductive trace overlap in a layout view.

20 Claims, 31 Drawing Sheets

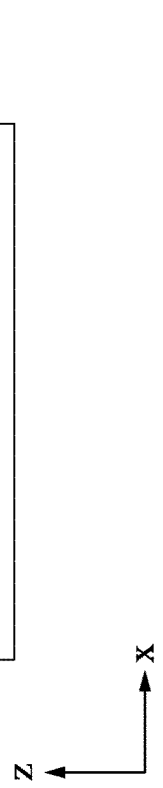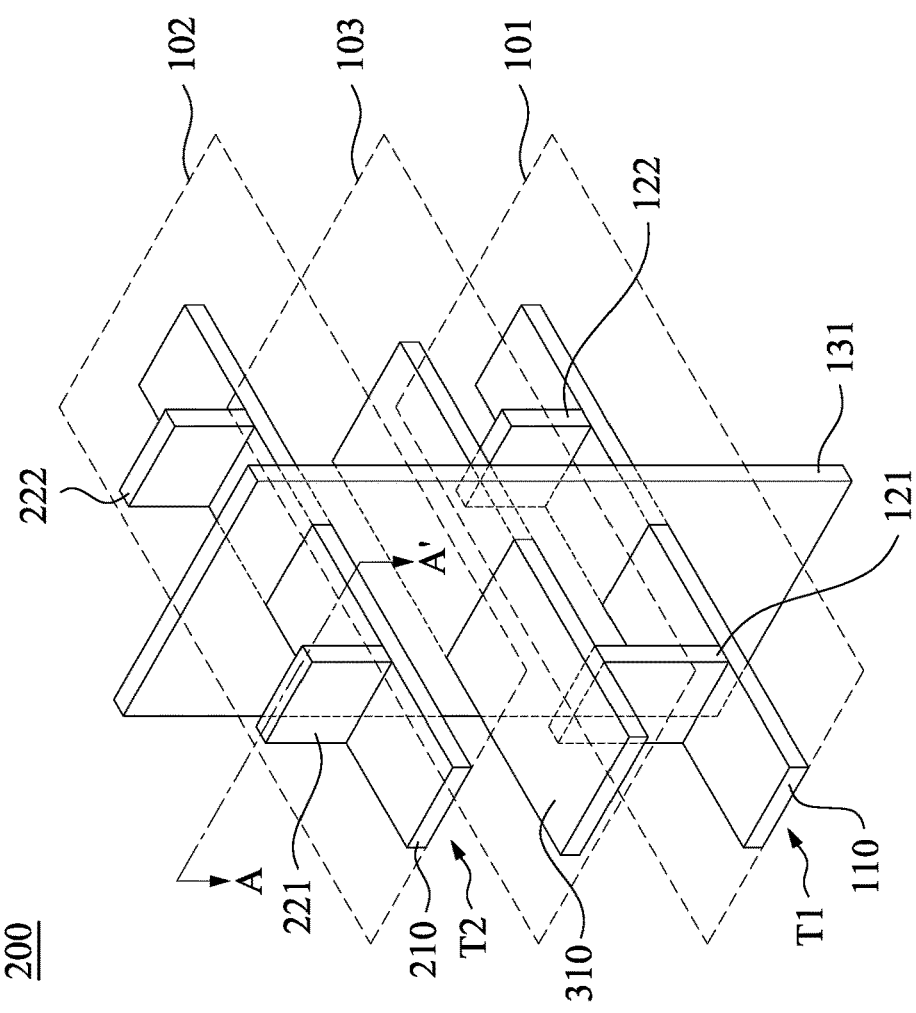
FIG. 2B
FIG. 2A

SEMICONDUCTOR DEVICE

CROSS-REFERENCE TO RELATED APPLICATION

The present application claims priority to U.S. Provisional Patent Application No. 62/867,831, filed on Jun. 27, 2019, which is incorporated by reference herein in its entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a FinFET and a gate-all-around (GAA) FET. A complementary FET (CFET) typically includes a first FET disposed on a substrate and a second FET disposed above the first FET. Multiple conductive structures are configured to couple components included in the CFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a perspective diagram of a semiconductor device, and FIG. 2B is a cross sectional view diagram of part of the semiconductor device of FIG. 2A, in accordance with various embodiments.

DETAILED DESCRIPTION

Figure 1B:
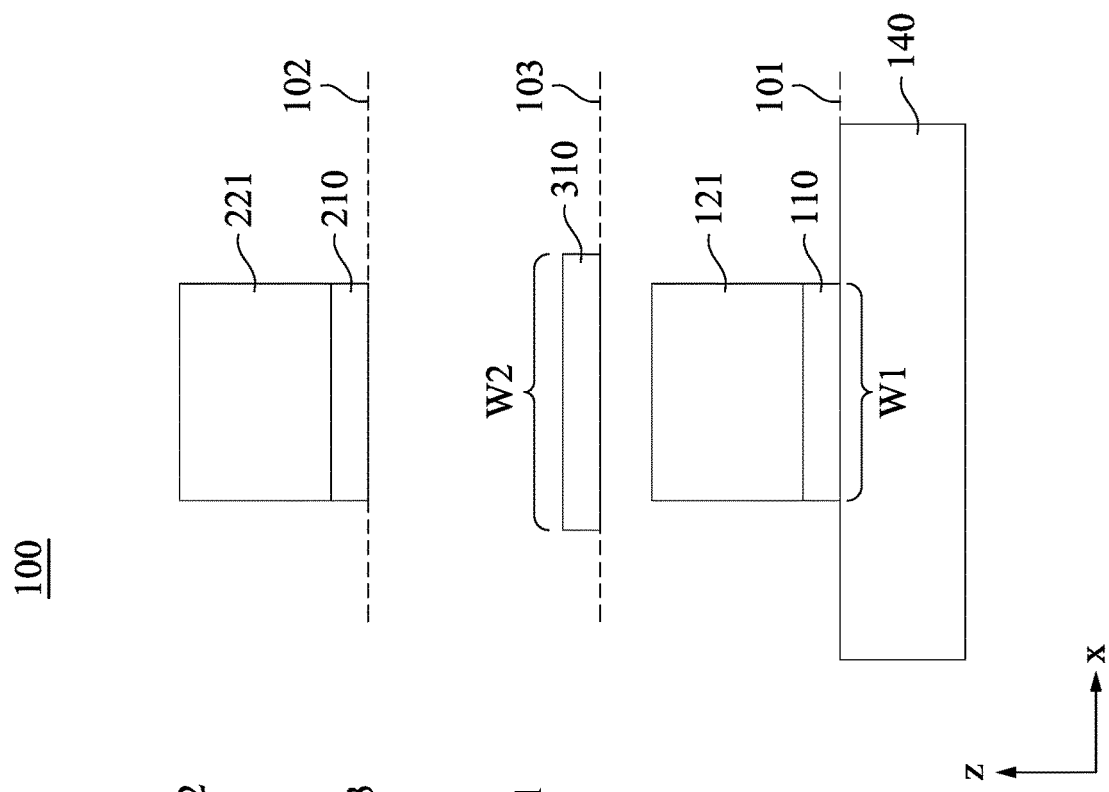
FIG. 1B is a cross sectional view diagram of part of the semiconductor device of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Figure 1A:
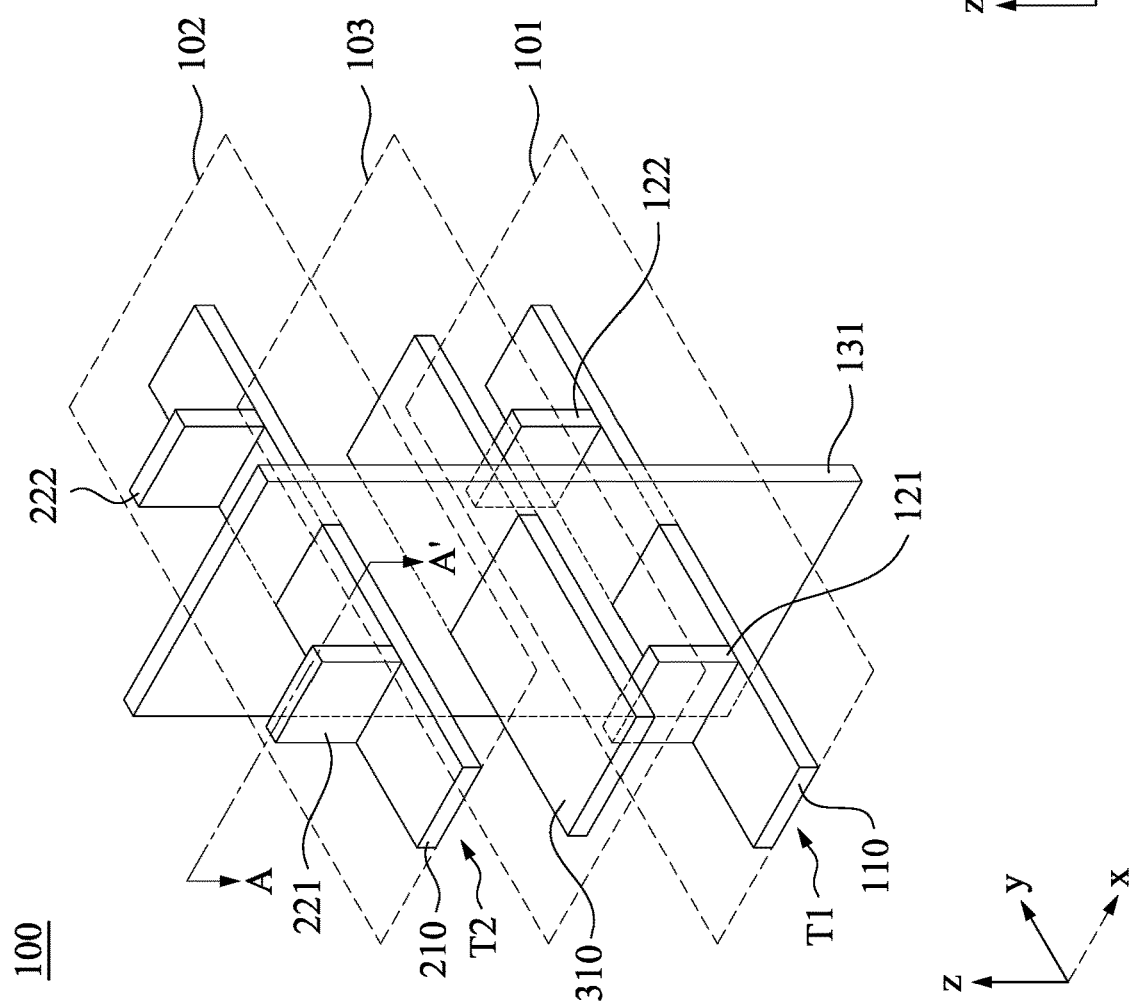
FIG. 1A is a perspective diagram of a semiconductor device.

Reference is made to FIG. 1A. FIG. 1A is a perspective diagram of a semiconductor device 100, in accordance with various embodiments. As shown in FIG. 1A, the semiconductor device 100 includes transistors T1-T2. For illustration, the transistor T2 is disposed above the transistor T1, and the transistor T1 is disposed on a substrate 140 (shown in FIG. 1B). Alternatively stated, the transistors T1-T2 are stacked and arranged vertically. In some embodiments, the semiconductor device 100 is a complementary field-effect transistor (CFET). In some embodiments, the transistors T1-T2 are both FinFETs. In some embodiments, the transistors T1-T2 are both gate-all-around (GAA) FETs. The above implementation of the semiconductor device 100 is given for illustrative purposes. Various implementations of the semiconductor device 100 are within the contemplated scope of the present disclosure. For example, in some embodiments, the semiconductor device 100 is implemented a logic gate circuit including AND, OR, NAND, MUX, Flip-flop, Latch, BUFF, inverter, or any other types of logic circuit.

In some embodiments, the transistor T1 is a first conductivity type FET (e.g., N-type), and the transistor T2 is a second conductivity type FET (e.g., P-type) different from the first conductivity type. However, the scope of the disclosure is not intended to be limiting of the present disclosure. For example, in some embodiments, the transistor T1 is a P-type transistor, and the transistor T2 is an N-type transistor. In other embodiments, the transistors T1-T2 have the same conductivity type.

For illustration, as shown in FIG. 1A, the transistor T1 includes active area 110 and conductive segments 121-122. The transistor T2 includes active area 210 and conductive segments 221-222. In some embodiments, the conductive segments 121-122 and 221-222 are also referred to as metal-zero layer over oxide-definition areas ("MOOD" or "MD") structures. The active area 110 and the conductive segments 121-122 are separate from the active area 210 and the conductive segments 221-222. Furthermore, the transistors T1-T2 share the gate 131.

In some embodiments, one of the conductive segments 121-122 corresponds to a drain of the transistor T1, and the other corresponds to a source of the transistor T1. One of the conductive segments 221-222 corresponds to a drain of the transistor T2, and the other corresponds to a source of the transistor T2. The gate 131 corresponds to gates of the transistors T1-T2.

As shown in FIG. 1A, the active area 110 extends in y direction on a layer 101, and the active area 210 extends in y direction on a layer 102. In this embodiment, the layers 101 and 102 are in a X-Y plane which is perpendicular to a vertical direction Z, in which layers define an active area where transistors is constructed.

In some embodiments, conductivity types of the active areas 110 and 120 define the conductivity types of the transistors T1 and T2. In some embodiments, the conductivity types of the active areas 110 and 120 are the first conductivity type (e.g., N-type) and the second conductivity type FET (e.g., P-type) different from the first conductivity type respectively. In another embodiment, the conductivity types of the active areas 110 and 120 are P-type and N-type respectively. In yet another embodiment, the conductivity types of the active areas 110 and 120 are same.

The conductive segments 121-122 are disposed on the active area 110 and separated from each other in x direction. The conductive segments 221-222 are disposed on the active area 210 and separated from each other in x direction. In some embodiments, the conductive segments 221 and 222 are arranged above the conductive segments 121 and 122.

In some embodiments, the conductive segments 121-122 and 221-222 are formed during the MEOL portion of the IC fabrication process. In some embodiments, the conductive segments 121-122 and 221-222 are conductive, but include a greater percentage of nonmetal material compared to metal material. In some embodiments, the conductive segments 121-122 and 221-222 are formed of a semiconductor using ion implantation sufficient to convert the semiconductor into a conductor.

The gate 131 extends in Z direction and crosses the active areas 110 and 210. In some embodiments, the gate 131 is adjacent to multiple (e.g., three or four) side surfaces of the active area 110 and adjacent to multiple (e.g., three or four) side surfaces of the active area 210.

In some embodiments, the gate 131 includes a gate dielectric layer (not shown) and a gate electrode layer (not shown). In some embodiments, the gate 131 is formed around channel regions of the transistors T1-T2, in which the channel regions include, for example, structures of round/square wire, nanoslab, nano-sheet, multi-bridge channel, nano-ring or any other suitable kinds of the nano structures.

As illustratively shown in FIG. 1A, the semiconductor device 100 further includes a conductive trace 310. In some embodiments, the conductive trace 310 is referred to as metal-zero layer over polysilicon ("MOPO" or "MP") structures. In some embodiments, a material of the conductive trace 310 is substantially similar to the material of the conductive segments 121-122 and 221-222. In various embodiments, the conductive trace 310 and the conductive segments 121-122 and 221-222 include substantially the same material.

For illustration, the conductive trace 310 extends in y direction on a layer 103. The layer 103, in the X-Y plane which is perpendicular to the vertical direction Z, is disposed between the layers 101-102, in which the layers 101-103 are separated from each other in z direction. Alternatively stated, the conductive trace 310 is disposed interposed between the active areas 110 and 210. As shown in FIG. 1A, the conductive trace 310 is also disposed between the conductive segments 121 and 221 and between the conductive segments 122 and 222. In some embodiments, the conductive trace 310 is in direct electrical contact with the gate 131. In some embodiments, a portion of the conductive trace 310 is embedded in the gate 131.

Reference is now made to FIG. 1B. FIG. 1B is a cross sectional view diagram of part of the semiconductor device 100 corresponding to a line AA' of FIG. 1A, in accordance with various embodiments. With respect to the embodiments of FIG. 1A, like elements in FIG. 1B are designated with the same reference numbers for ease of understanding.

As shown in FIG. 1B, the active area 110 of the transistor T1 is disposed on the substrate 140 and on the layer 101. The active area 120 of the transistor T2 is disposed on the layer 102 above the layer 101. The conductive trace 310 is disposed on the layer 103 interposed between the layers 101-102. The layers 101-103 are arranged parallel to each other. Alternatively stated, the conductive trace 310 is interposed between the conductive segment 221 and the substrate 140.

For illustration, a projection of the active area 210 and a projection of the conductive trace 310 on the substrate 140 overlap a projection of the active area 110 when viewed from the vertical direction (Z direction). Projections of the conductive segments 121 and 221 in z direction on the substrate 140 overlap the projection of the active area 110. Alternatively stated, the projections of the active areas 110 and 210 and the conductive segments 121 and 221 overlap the projection of the conductive trace 310 in z direction on the substrate 140.

Furthermore, the active areas 110 and 210 have a width W1. The conductive trace 310 has a width W2. In some embodiments, the width W1 is different from the width. In various embodiments, the widths W1 and W2 are the same.

Figure 1C:
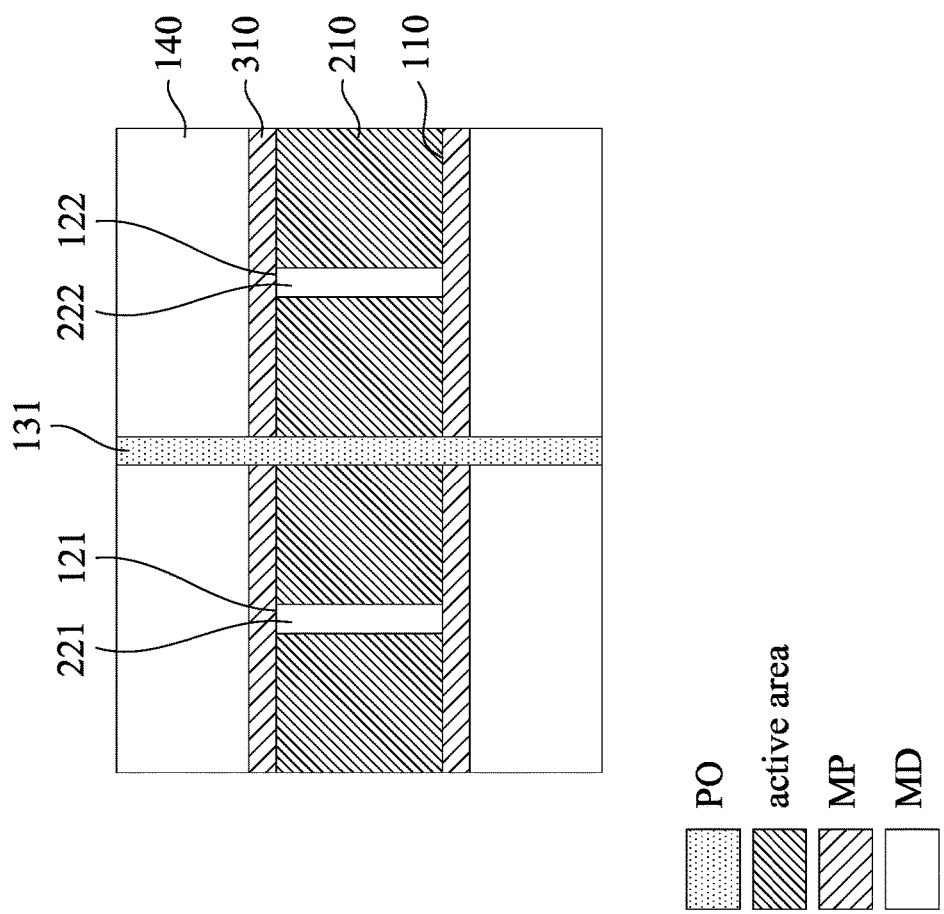
FIG. 1C is a layout diagram in a plan view of part of the semiconductor device of FIG. 1A, in accordance with various embodiments.

Reference is now made to FIG. 1C. FIG. 1C is a layout diagram in a plan view of part of the semiconductor device 100 of FIG. 1A, in accordance with various embodiments. With respect to the embodiments of FIGS. 1A-1B, like elements in FIG. 1C are designated with the same reference numbers for ease of understanding.

As shown in FIG. 1C, the active areas 110 and 210, the conductive segments 121-122, 221-222, and the conductive trace 310 overlap each other. The gate 131 crosses the active areas 110 and 210, the conductive segments 121-122, 221-222, and the conductive trace 310 in the layout view. Alternatively stated, a projection of the gate 131 overlaps the projection of the conductive trace 310 on the substrate 140.

Figure 1E:
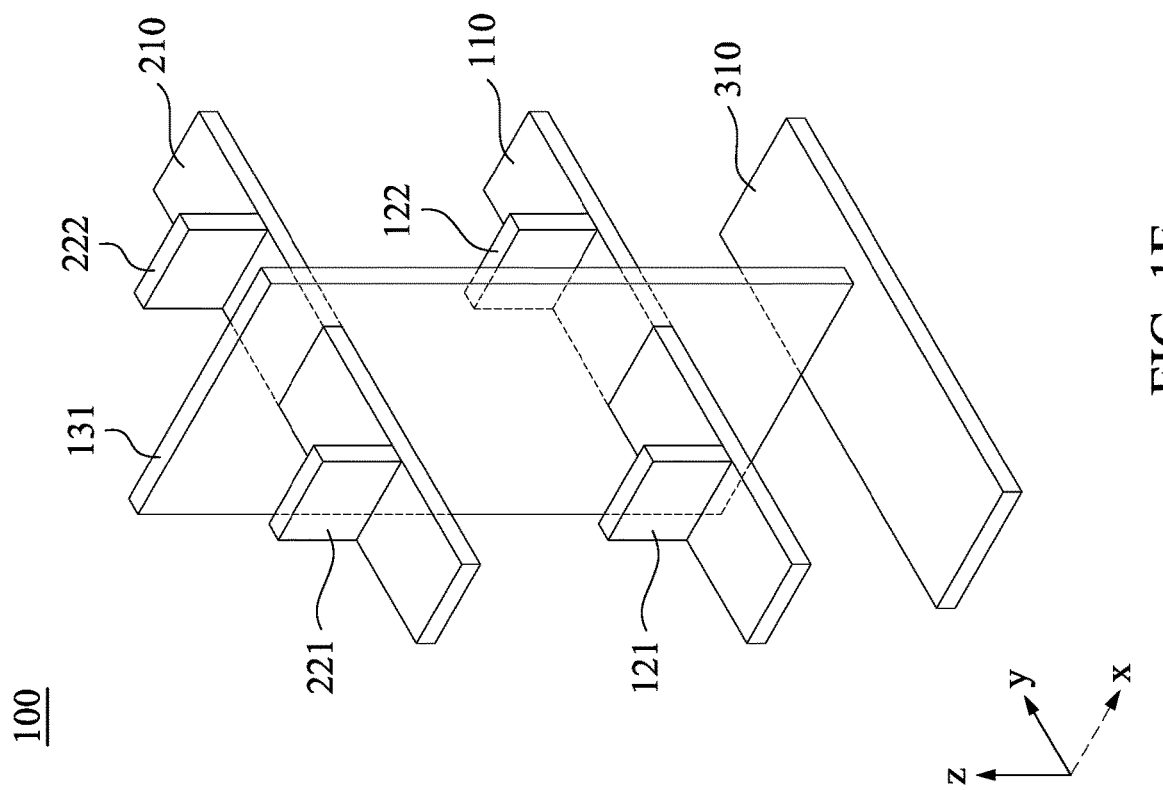
FIGS. 1D-1E are perspective diagrams of semiconductor devices corresponding to that of FIG. 1A, in accordance with various embodiments.
Figure 1D:
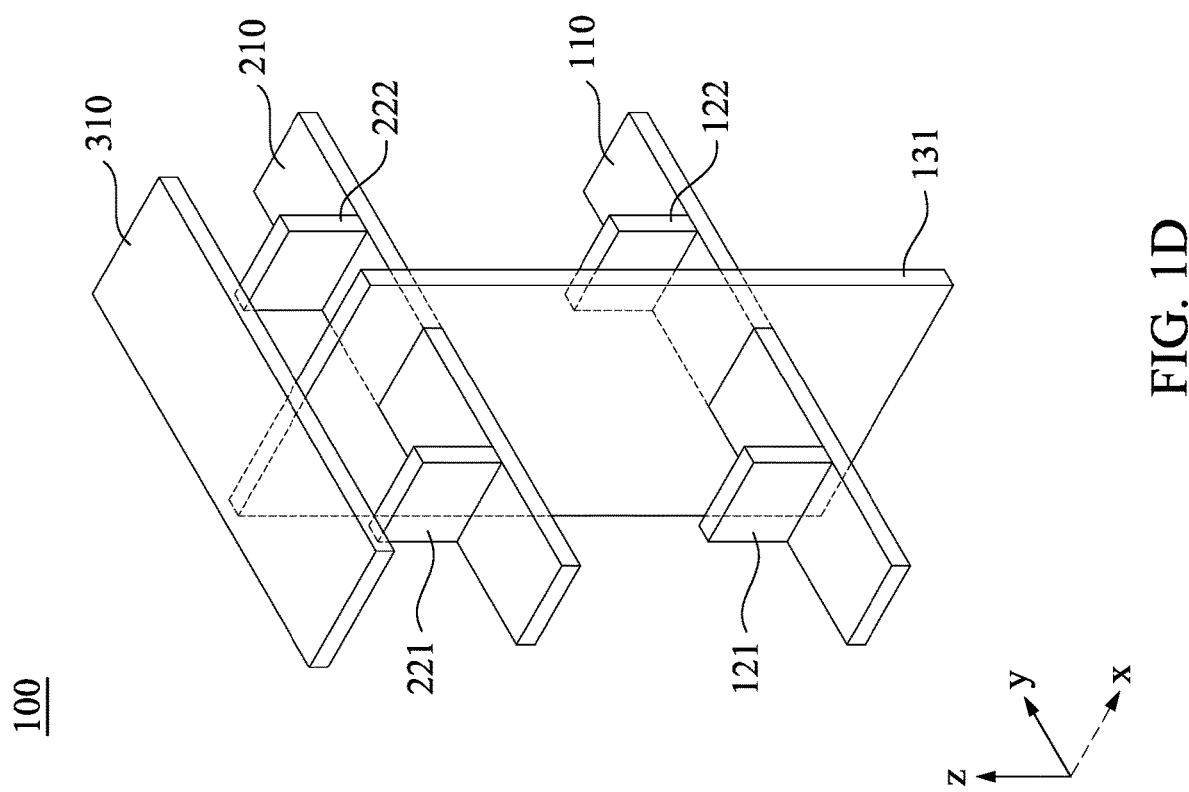

Reference is now made to FIGS. 1D-1E. FIGS. 1D-1E are perspective diagrams of semiconductor devices corresponding to that of FIG. 1A, in accordance with various embodiments. With respect to the embodiments of FIGS. 1A-1C, like elements in FIGS. 1D-1E are designated with the same reference numbers for ease of understanding.

As illustratively shown in FIG. 1D, compared with FIG. 1A, instead of the conductive trace 310 being interposed between the active areas 110 and 210 and being coupled to the gate 131, the conductive trace 310 of FIG. 1D is arranged above the active area 210, the conductive segments 221-222, and the gate 131 without being coupled to the gate 131. Alternatively stated, the layer 103 is arranged above the layers 101-102.

As illustratively shown in FIG. 1E, compared with FIGS. 1A and 1D, the conductive trace 310 is arranged below the active area 110 and the gate 131. In some embodiments, the conductive trace 310 is disposed over the substrate 140. In some embodiments, the conductive trace 310 is coupled to the gate 131.

With the configurations of FIGS. 1A-1E, by implementing the conductive trace 310 for connection in the stacked transistors of the semiconductor device, the routing resources (i.e., metal zero MO routing above the transistor) is preserved, and accordingly reduce an integrated circuit included in the semiconductor device.

The configurations of FIGS. 1A-1E are given for illustrative purposes. Various implements are within the contemplated scope of the present disclosure. For example, in some embodiments, the active areas 110 and 210 and the conductive segments 121-122, and 221-222 partially overlap with each other in the layout view.

Reference is now to FIG. 2A. FIG. 2A is a perspective diagram of a semiconductor device 200, in accordance with various embodiments. With respect to the embodiments of FIGS. 1A-1E, like elements in FIG. 2A are designated with the same reference numbers for ease of understanding.

Compared with FIG. 1A, the conductive segment 121 is coupled to the conductive trace 310, while the conductive trace 310 is coupled to the gate 131. Alternatively stated, the conductive trace 310 is configured to couple the conductive segment 121 to the gate 131.

Reference is now made to FIG. 2B. FIG. 2B is a cross sectional view diagram of part of the semiconductor device 200 of FIG. 2A, in accordance with various embodiments. With respect to the embodiments of FIGS. 1A-2A, like elements in FIG. 2B are designated with the same reference numbers for ease of understanding.

Compared with FIG. 1B, the conductive segment 121 extends in z direction and connects the conductive trace 310.

The configurations of FIGS. 2A-2B are given for illustrative purposes. Various implements are within the contemplated scope of the present disclosure. For example, in some embodiments, a portion of the conductive trace 310 extends in z direction toward the substrate 140 to be coupled to the conductive segment 121. Alternatively stated, the conductive trace 310 extends in a desired direction to couple the components in the semiconductor device 200 to the gate 310.

Figure 3B:
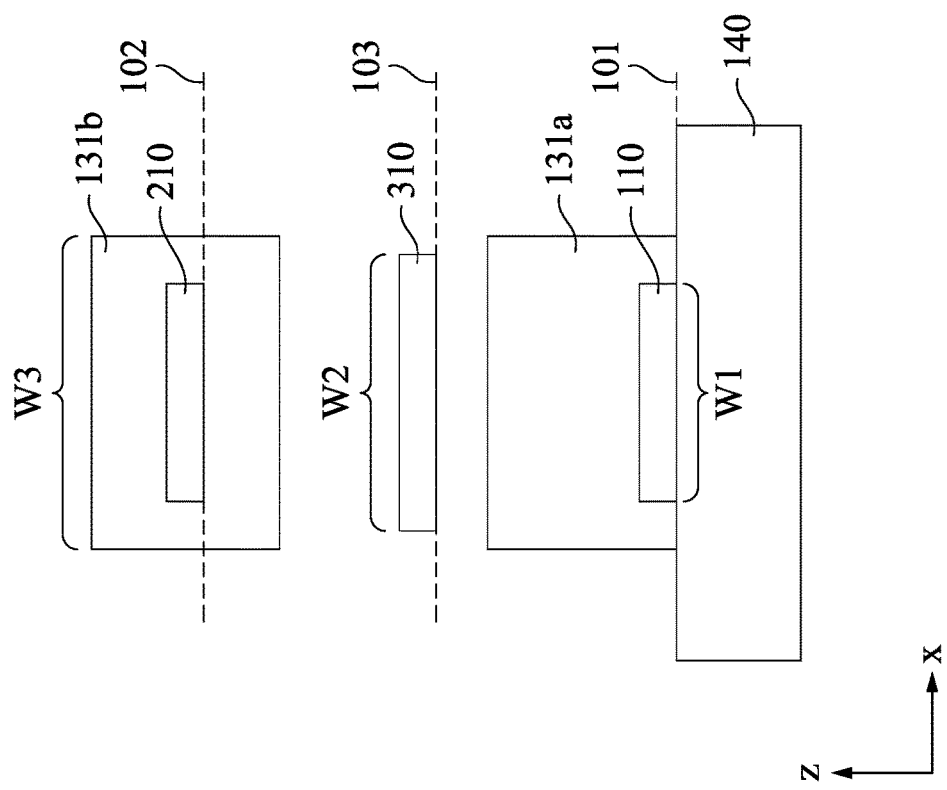
FIG. 3B is a cross sectional view diagram of part of the semiconductor device of FIG. 3A.
Figure 3A:
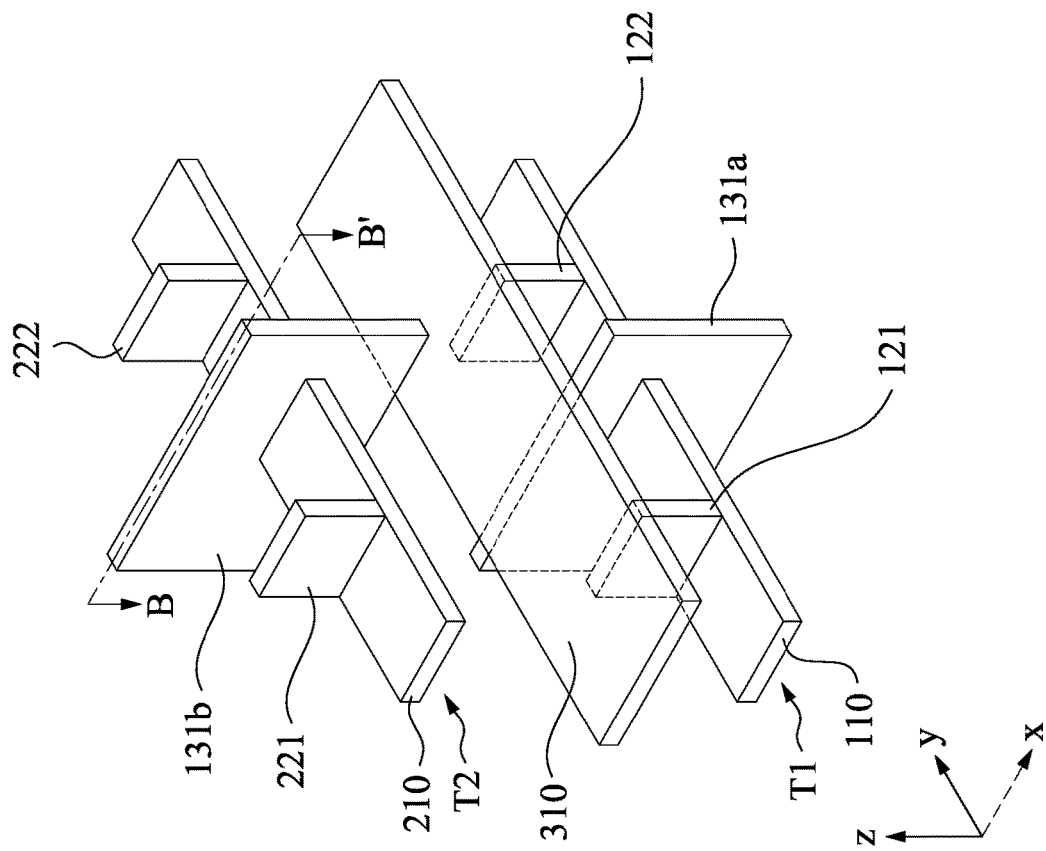
FIG. 3A is a perspective diagram of a semiconductor device.

Reference is now to FIG. 3A. FIG. 3A is a perspective diagram of a semiconductor device 300, in accordance with various embodiments. With respect to the embodiments of FIGS. 1A-2B, like elements in FIG. 3A are designated with the same reference numbers for ease of understanding.

Compared with FIG. 1A, the gate 131 is broken into two gates 131a-131b. For illustration, the gates 131a-131b are separated from each other in z direction. Accordingly, the conductive trace 310 passes through and is interposed between the gates 131a-131b. In some embodiments, some components, of the semiconductor device 300, disposed on the opposite sides of the transistors T1-T2 are coupled together through the conductive trace 310. Accordingly, the routing resource in metal layers, assigned for connecting those components, above the gate 131*b* is saved by implementing the conductive trace 310.

Reference is now made to FIG. 3B. FIG. 3B is a cross sectional view diagram of part of the semiconductor device 300 of FIG. 3A, in accordance with various embodiments. With respect to the embodiments of FIGS. 1A-3A, like elements in FIG. 3B are designated with the same reference numbers for ease of understanding.

For illustration, the gates 131*a*-131*b* are not coupled to the each other nor to the conductive trace 310. In some embodiments, the gates 131*a*-131*b* have a width W3 greater than the widths W1-W2.

Figure 3C:
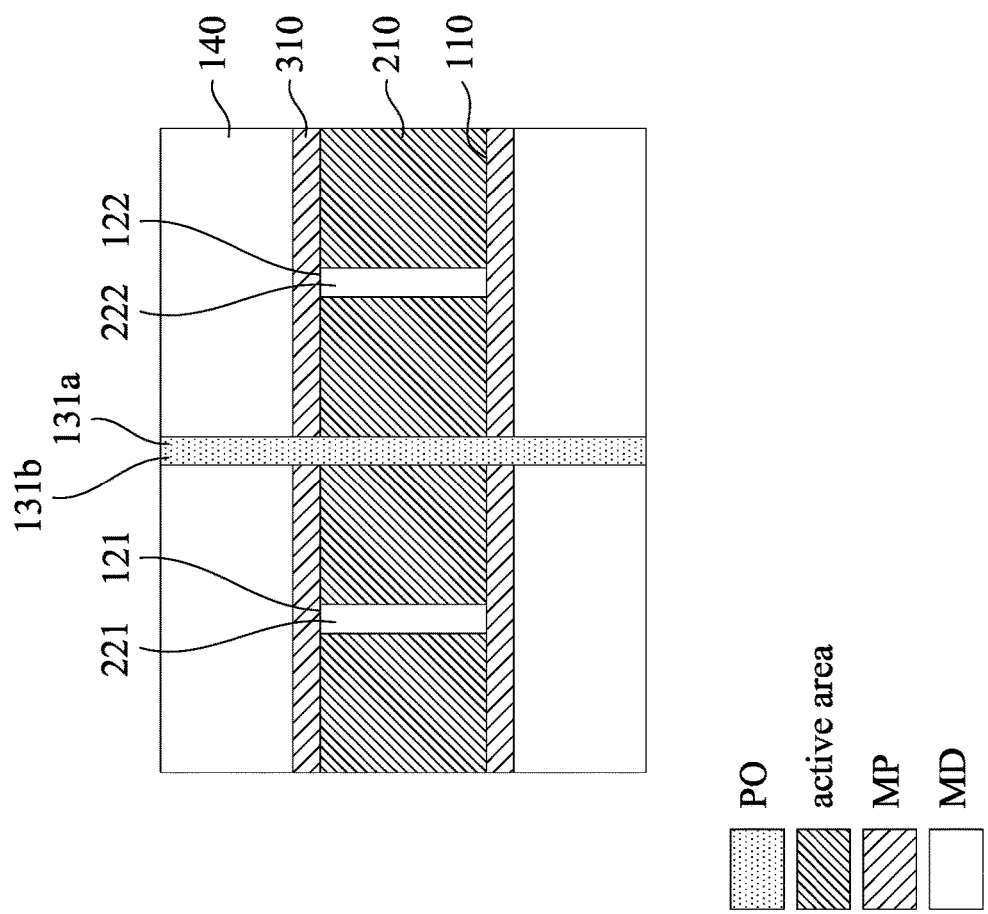
FIG. 3C is a layout diagram in a plan view of part of the semiconductor device of FIG. 3A, in accordance with various embodiments.

Reference is now made to FIG. 3C. FIG. 3C is a layout diagram in a plan view of part of the semiconductor device 300 of FIG. 3A, in accordance with various embodiments. With respect to the embodiments of FIGS. 1A-3B, like elements in FIG. 3C are designated with the same reference numbers for ease of understanding.

Compared with FIG. 1C, the gates 131*a*-131*b* overlap in the layout view and further overlap the active areas 110 and 210 and the conductive trace 310.

The configurations of FIGS. 3A-3C are given for illustrative purposes. Various implements are within the contemplated scope of the present disclosure. For example, in some embodiments, one of the gates 131*a*-131*b* is coupled to the conductive trace 310.

Figure 4A:
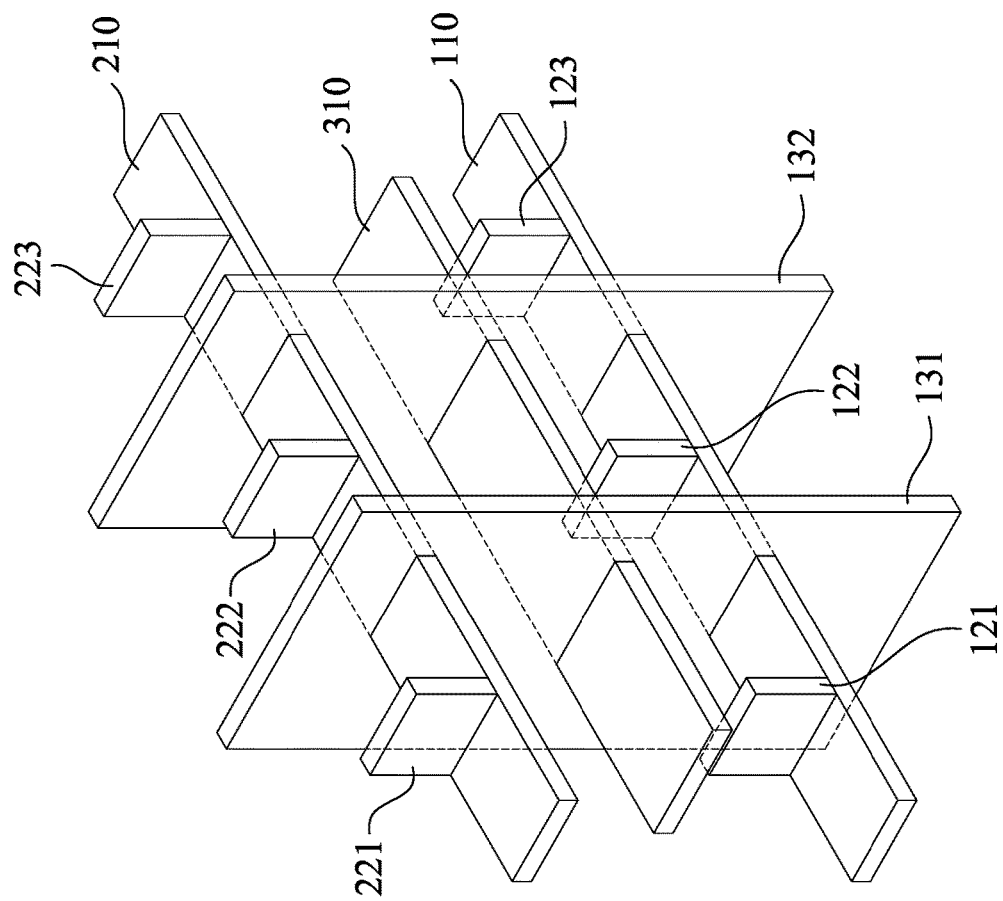
FIG. 4A is a perspective diagram of a semiconductor device.

Reference is now to FIG. 4A. FIG. 4A is a perspective diagram of a semiconductor device 400, in accordance with various embodiments. With respect to the embodiments of FIGS. 1A-3C, like elements in FIG. 4A are designated with the same reference numbers for ease of understanding.

Compared with the semiconductor device 100 in FIG. 1A, the semiconductor device 400 further includes conductive segments 123 and 223 and a gate 132. In some embodiments, the conductive segments 123 and 223 are configured with respect to, for example, the conductive segments 121 and 221 respectively. The gate 132 is configured with respect to, for example, the gate 131.

In some embodiments, the conductive segment 123 corresponds to the drain or the source of the transistor T1, and the conductive segment 223 corresponds to the drain or source of the transistor T2. In various embodiments, the conductive segments 123 and 223 do not correspond to terminals of the transistors T1-T2. In various embodiments, the gate 132 corresponds to the gates of the transistors T1-T2. In various embodiments, the gate 132 corresponds to gates of transistors rather than the transistors T1-T2. In various embodiments, the gate 132 is referred to as a dummy gate, in which the term "dummy" corresponds to having no practical function in a circuit.

The conductive segment 123 is disposed on the active area 110 and is separated from the conductive segment 122 in y direction. The conductive segment 223 is disposed on the active area 210 and is separated from the conductive segment 222 in y direction. In some embodiments, the conductive segment 223 is above the conductive segment 123.

The gate 132 extends in z direction and crosses the active areas 110 and 210. The gates 131-132 are separated from each other in y direction. In some embodiments, the gate 132 is adjacent to multiple (e.g., three or four) side surfaces of the active area 110 and adjacent to multiple (e.g., three or four) side surfaces of the active area 210.

For illustration, the conductive trace 310 further passes the gate 310 and is coupled to the gate 132. Accordingly, the gate 131 is coupled to the gate 132 through the conductive trace 310.

Figure 4B:
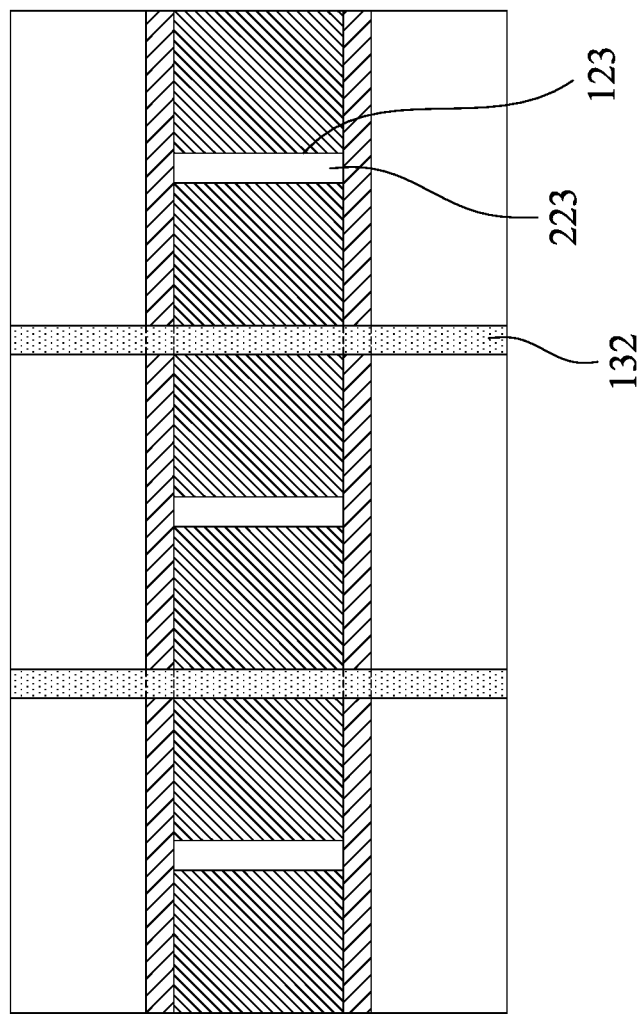
FIG. 4B is a layout diagram in a plan view of part of the semiconductor device of FIG. 4A, in accordance with various embodiments.

Reference is now made to FIG. 4B. FIG. 4B is a cross sectional view diagram of part of the semiconductor device 400 of FIG. 4A, in accordance with various embodiments. With respect to the embodiments of FIGS. 1A-4A, like elements in FIG. 4B are designated with the same reference numbers for ease of understanding.

For illustration, the gate 132 and the conductive segments 123, 223 overlap the conductive trace 310 in the layout view.

The configurations of FIGS. 4A-4B are given for illustrative purposes. Various implements are within the contemplated scope of the present disclosure. For example, in some embodiments, the conductive segments 121 and 123 further extend in z direction to be coupled together by coupling to the conductive trace 310.

Figure 5A:
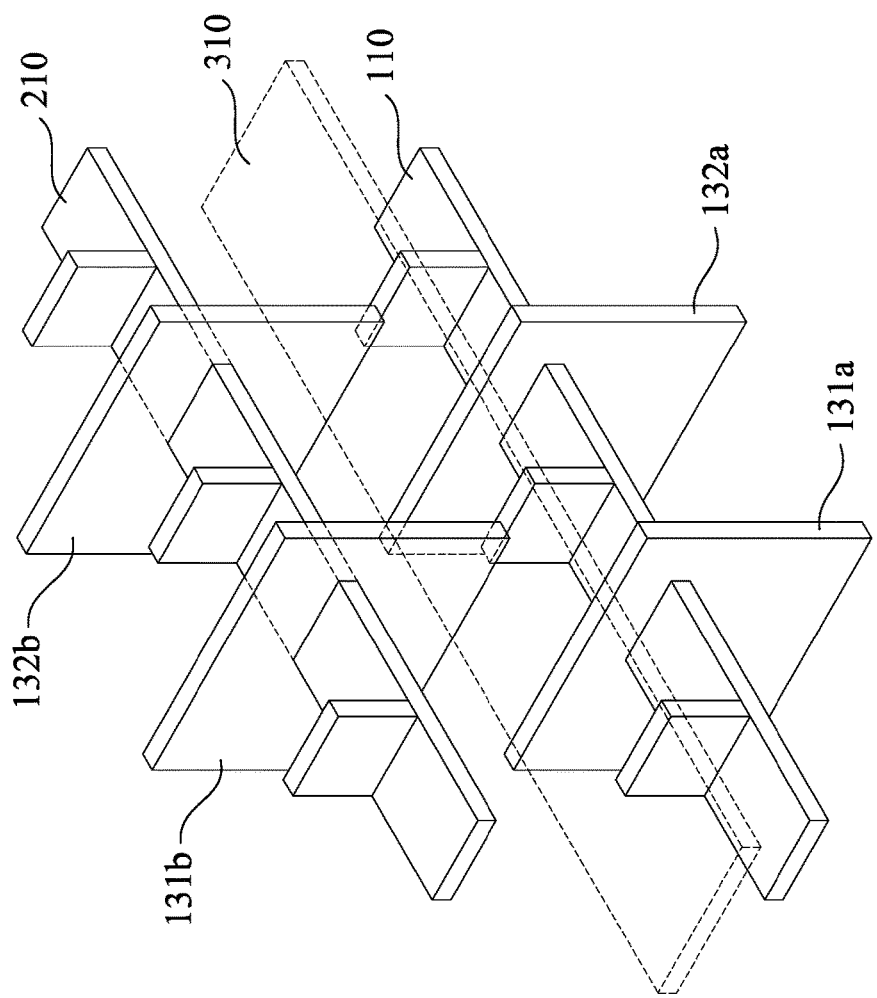
FIG. 5A is a perspective diagram of a semiconductor device.

Reference is now to FIG. 5A. FIG. 5A is a perspective diagram of a semiconductor device 500, in accordance with various embodiments. With respect to the embodiments of FIGS. 1A-4B, like elements in FIG. 5A are designated with the same reference numbers for ease of understanding.

Compared with FIG. 4A, the gate 131 has been broken into the gates 131*a*-131*b* as shown in FIG. 3A, and the gate 132 is broken into two gates 132*a*-132*b*. For illustration, the gate 132*a* crosses the active area 110, and the gate 132*b* crosses the active area 210. In some embodiments, the gate 132*b* is disposed above the gate 132*a*. The gates 132*a*-132*b* are separated from each other in z direction. Accordingly, the conductive trace 310 further passes through the gates 132*a*-132*b* and is interposed between the gates 132*a*-132*b*.

Figure 5B:
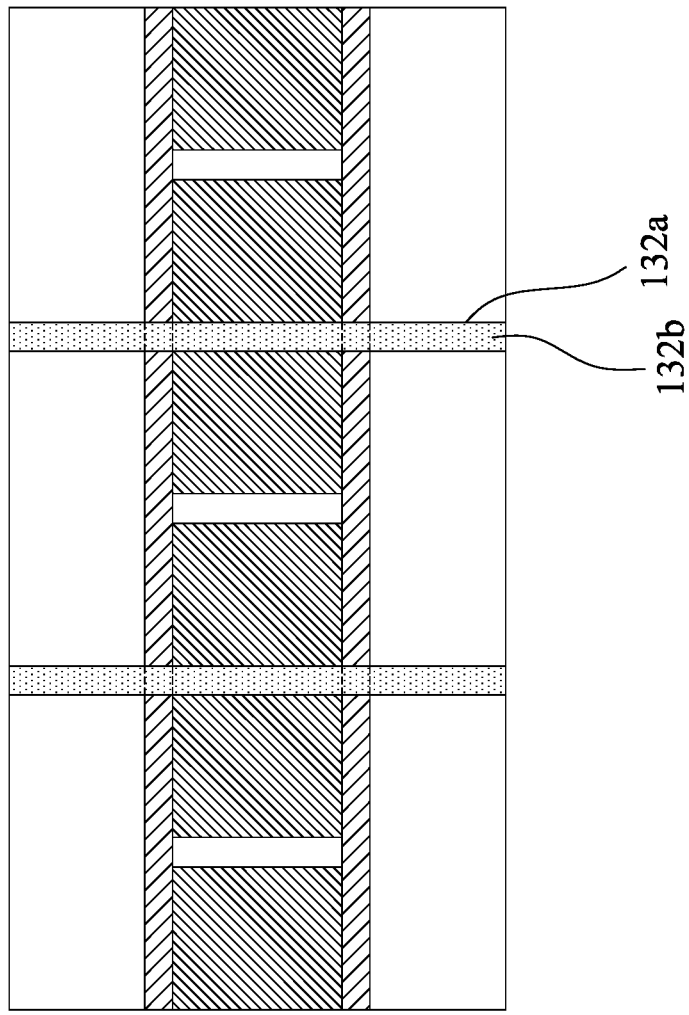
FIG. 5B is a layout diagram in a plan view of part of the semiconductor device of FIG. 5A, in accordance with various embodiments.

Reference is now made to FIG. 5B. FIG. 5B is a cross sectional view diagram of part of the semiconductor device 500 of FIG. 5A, in accordance with various embodiments. With respect to the embodiments of FIGS. 1A-5A, like elements in FIG. 5B are designated with the same reference numbers for ease of understanding.

Compared with FIG. 4B, the gates 132*a*-132*b* overlap in the layout view and further overlap the active areas 110 and 210 and the conductive trace 310.

The configurations of FIGS. 5A-5B are given for illustrative purposes. Various implements are within the contemplated scope of the present disclosure. For example, in some embodiments, the gates 132*a*-132*b* correspond to transistors rather than the transistors T1-T2. In various embodiments, the conductive trace 310 is disposed above the gates 131*b* and 132*b*. In various embodiments, the conductive trace 310 is disposed below the gates 131*a* and 132*a*.

Figure 6:
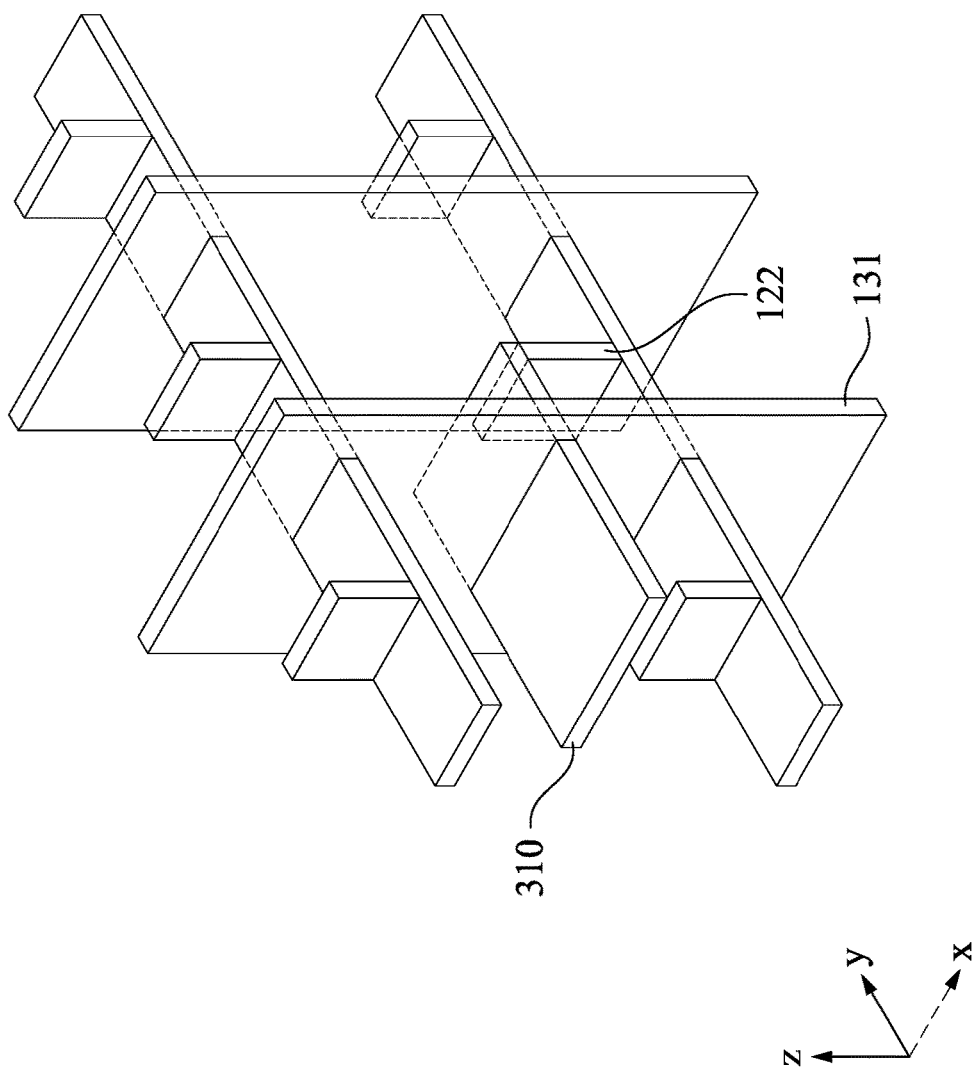
FIG. 6 is a perspective diagram of a semiconductor device, in accordance with various embodiments.

Reference is now made to FIG. 6. FIG. 6 is a perspective diagram of a semiconductor device 600, in accordance with various embodiments. With respect to the embodiments of FIGS. 1A-5B, like elements in FIG. 6 are designated with the same reference numbers for ease of understanding.

Compared with the semiconductor device 400 of FIG. 4A, the conductive segment 122 of the semiconductor device 600 further extends in z direction to couple to the conductive trace 310. Accordingly, the conductive trace 310 is configured to couple the gate 131 to the conductive segment 122.

Figure 7:
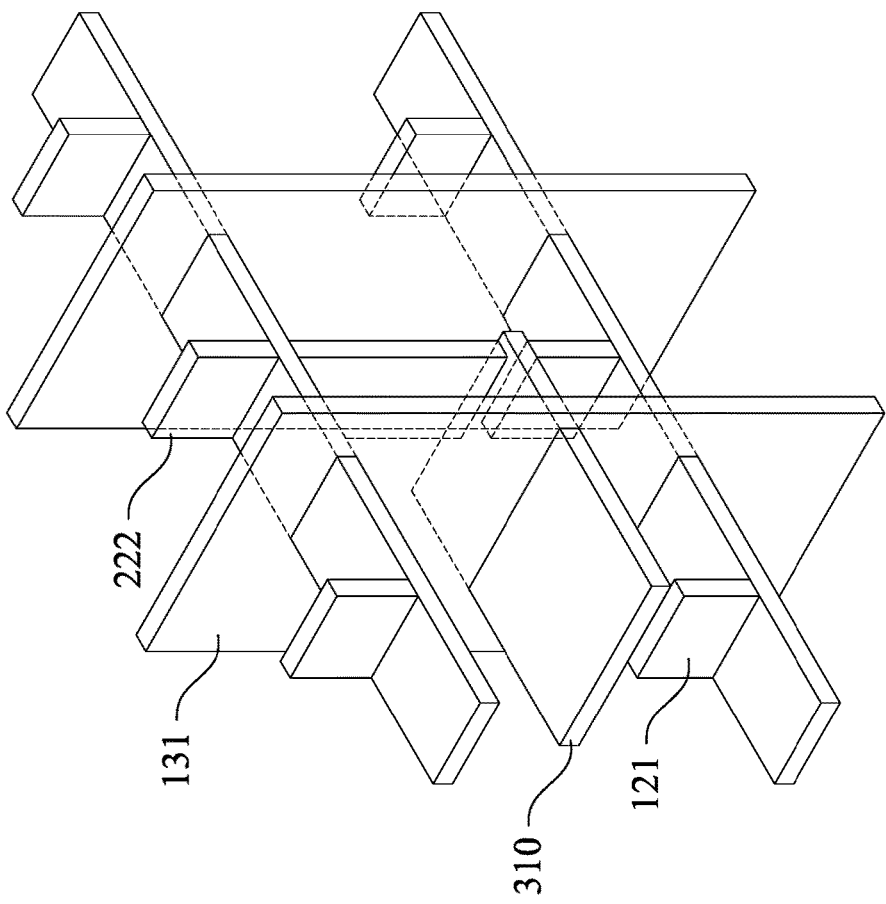
FIG. 7 is a perspective diagram of a semiconductor device, in accordance with various embodiments.

Reference is now made to FIG. 7. FIG. 7 is a perspective diagram of a semiconductor device 700, in accordance with various embodiments. With respect to the embodiments of FIGS. 1A-6, like elements in FIG. 7 are designated with the same reference numbers for ease of understanding.

Compared with the semiconductor device 400 of FIG. 4A, the conductive segment 222 of the semiconductor device 700 further extends in z direction to couple to the conductive trace 310. Accordingly, the conductive trace 310 is configured to couple the gate 131 to the conductive segment 122. In some embodiments, the portion of conductive segment 222 below the active area 210 is formed by extending a portion of the conductive trace 310 under the conductive segment 222 in z direction to couple to the active area 210.

Figure 8:
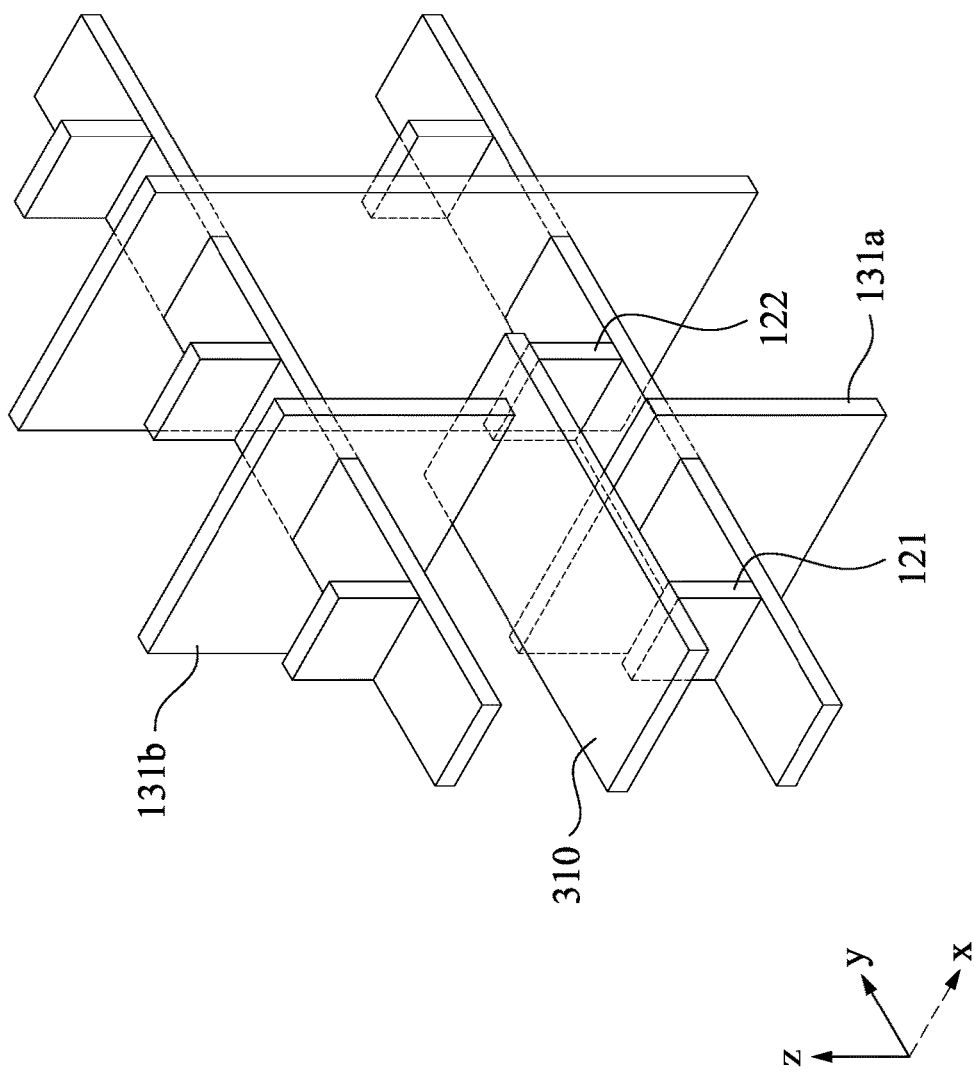
FIG. 8 is a perspective diagram of a semiconductor device, in accordance with various embodiments.

Reference is now made to FIG. 8. FIG. 8 is a perspective diagram of a semiconductor device 800, in accordance with various embodiments. With respect to the embodiments of FIGS. 1A-7, like elements in FIG. 8 are designated with the same reference numbers for ease of understanding.

Compared with the semiconductor device 500 of FIG. 5A, instead of having separated gates 132a-132b, the semiconductor device 800 has the unbroken gate 132. In addition, the conductive segments 121-122 of the semiconductor device 800 further extend in z direction to couple to the conductive trace 310. Accordingly, the conductive trace 310 is configured to couple the conductive segment 121 to the conductive segment 122.

Figure 9:
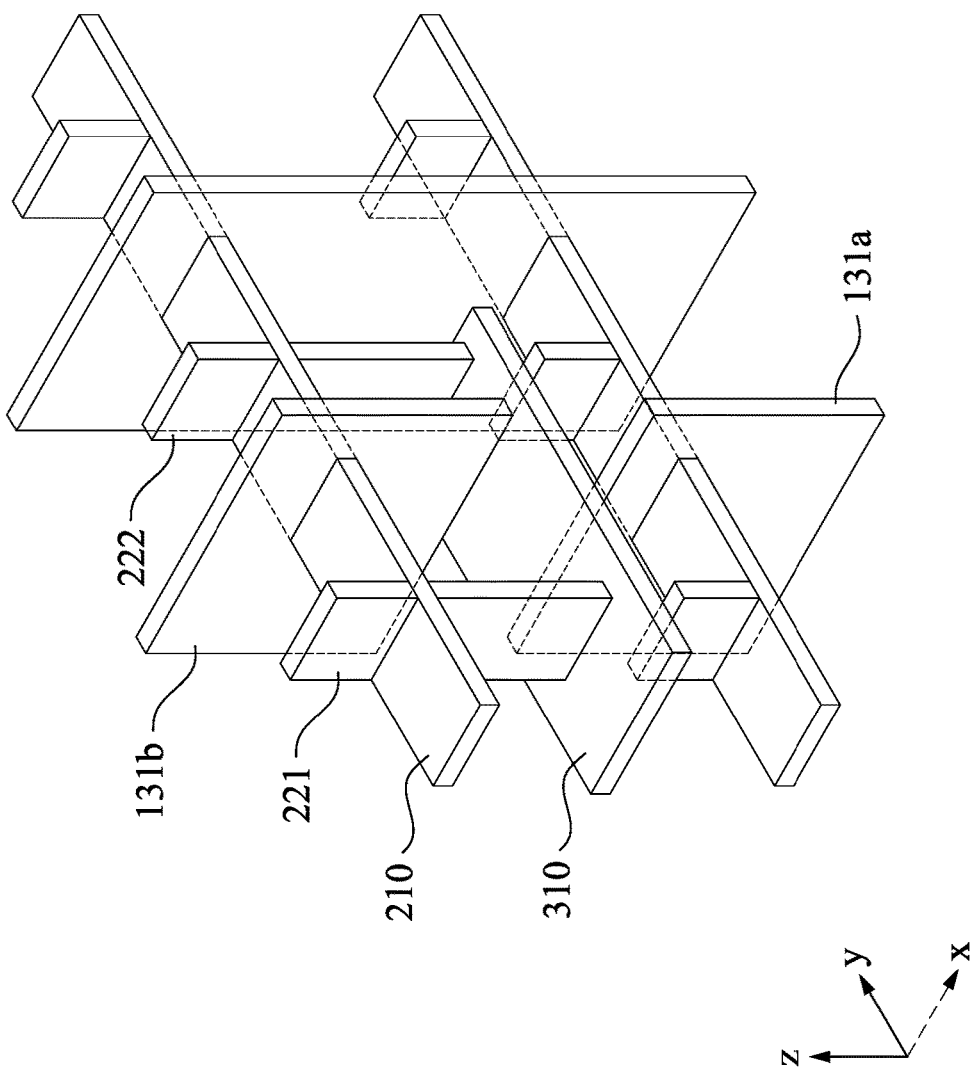
FIG. 9 is a perspective diagram of a semiconductor device, in accordance with various embodiments.

Reference is now made to FIG. 9. FIG. 9 is a perspective diagram of a semiconductor device 900, in accordance with various embodiments. With respect to the embodiments of FIGS. 1A-8, like elements in FIG. 9 are designated with the same reference numbers for ease of understanding.

Compared with the semiconductor device 800 of FIG. 8, instead of the conductive segments 121-122 extending in z direction to couple the conductive trace 310, the conductive segments 221-222 extend in z direction to couple to the conductive trace 310. Accordingly, the conductive trace 310 is configured to couple the conductive segments 221 to the conductive segment 222. In some embodiments, the portion of conductive segment 221 below the active area 210 is formed by extending a portion of the conductive trace 310 under the conductive segment 221 in z direction to couple to the active area 210, and the portion of conductive segment 222 below the active area 210 is formed by extending a portion of the conductive trace 310 under the conductive segment 222 in z direction to couple to the active area 210.

Figure 10:
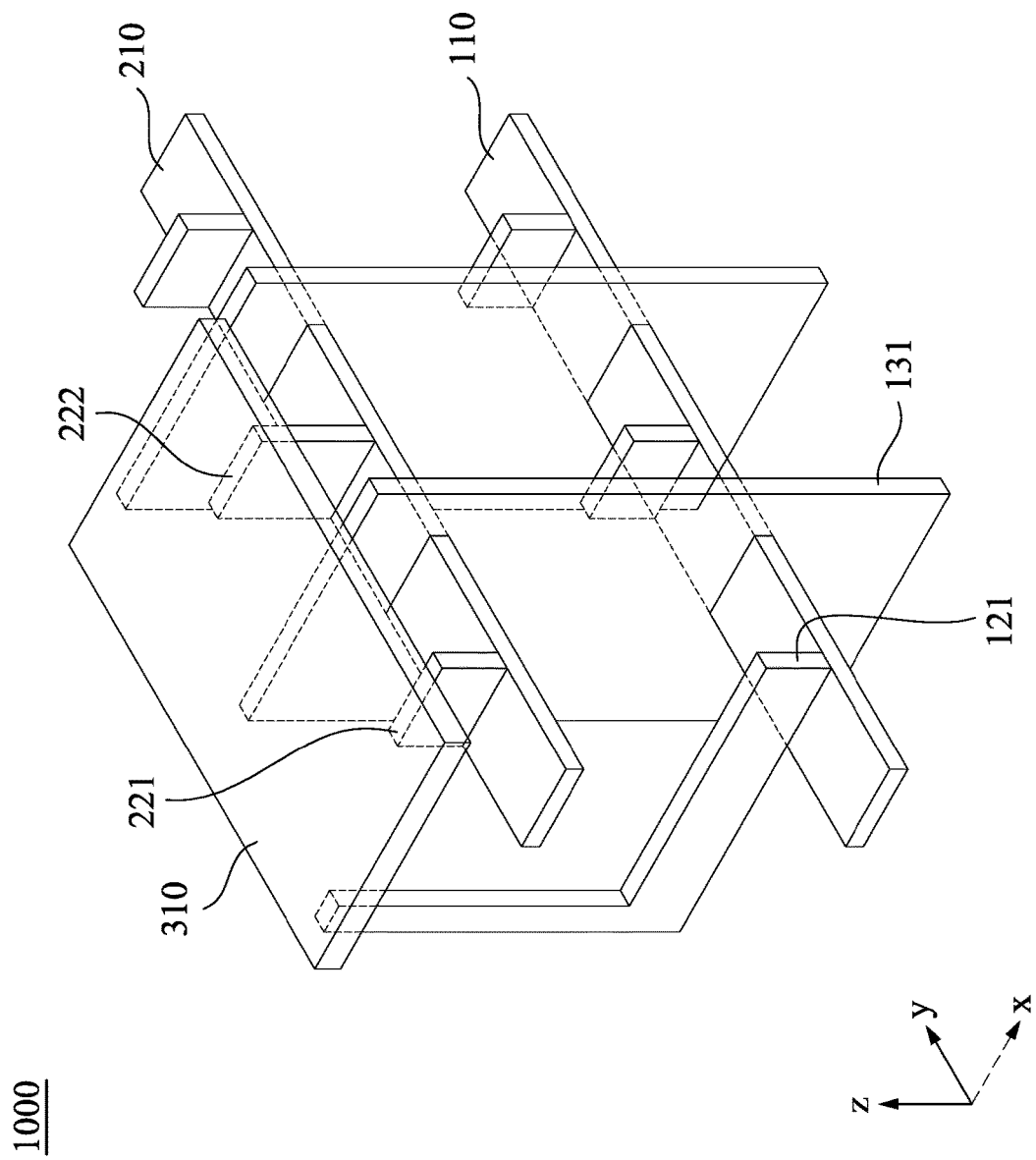
FIG. 10 is a perspective diagram of a semiconductor device, in accordance with various embodiments.

Reference is now made to FIG. 10. FIG. 10 is a perspective diagram of a semiconductor device 1000, in accordance with various embodiments. With respect to the embodiments of FIGS. 1A-9, like elements in FIG. 10 are designated with the same reference numbers for ease of understanding.

Compared with the semiconductor device 700 of FIG. 7, instead of the conductive trace 310 interposed between the active areas 110 and 210, the conductive trace 310 of the semiconductor device 1000 is arranged above the active area 210 as shown in FIG. 10. For illustration, the conductive segment 222 further extends in z direction and is coupled to the conductive trace 310 above it. The conductive segment 121 further includes a first portion extending in x direction and a second portion extending in z direction to be coupled to the conductive trace 310. Alternatively stated, the conductive segment 121 is L-shaped. Accordingly, the conductive segments 121 and 222 are coupled to each other through the conductive trace 310. As shown in FIG. 10, the conductive trace 310 overlaps the active areas 110 and 210, the conductive segments 121-122 and 221-222, and the gate 131.

Figure 11:
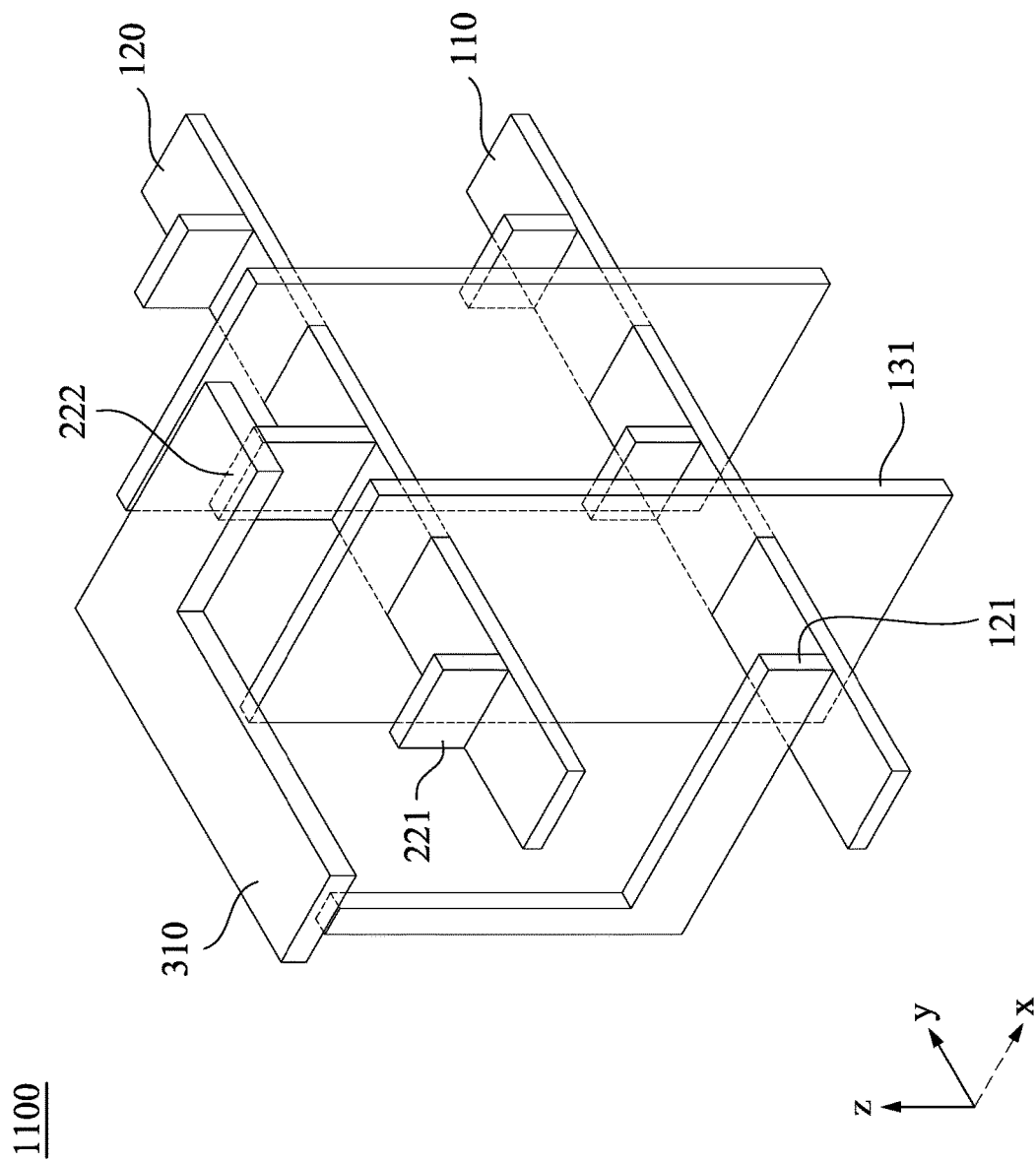
FIG. 11 is a perspective diagram of a semiconductor device, in accordance with various embodiments.

Reference is now made to FIG. 11. FIG. 11 is a perspective diagram of a semiconductor device 1100, in accordance with various embodiments. With respect to the embodiments of FIGS. 1A-10, like elements in FIG. 11 are designated with the same reference numbers for ease of understanding.

Compared with the semiconductor device 1000 of FIG. 10, instead of having the rectangle conductive trace 310, the conductive trace 310 in the semiconductor device 1100 is L-shaped. For illustration, the conductive trace 310 has first and second portions. The first portion extends in y direction and is coupled to the conductive segment 121. In some embodiments, the first portion of the conductive trace 310 does not overlap the active area 210 and the conductive segments 221-222. The second portion extends in x direction and is coupled to the first portion of the conductive trace 310 and the conductive segment 222. Accordingly, the second portion of the conductive trace 310 does not overlap the conductive segments 121 and 221.

Figure 12:
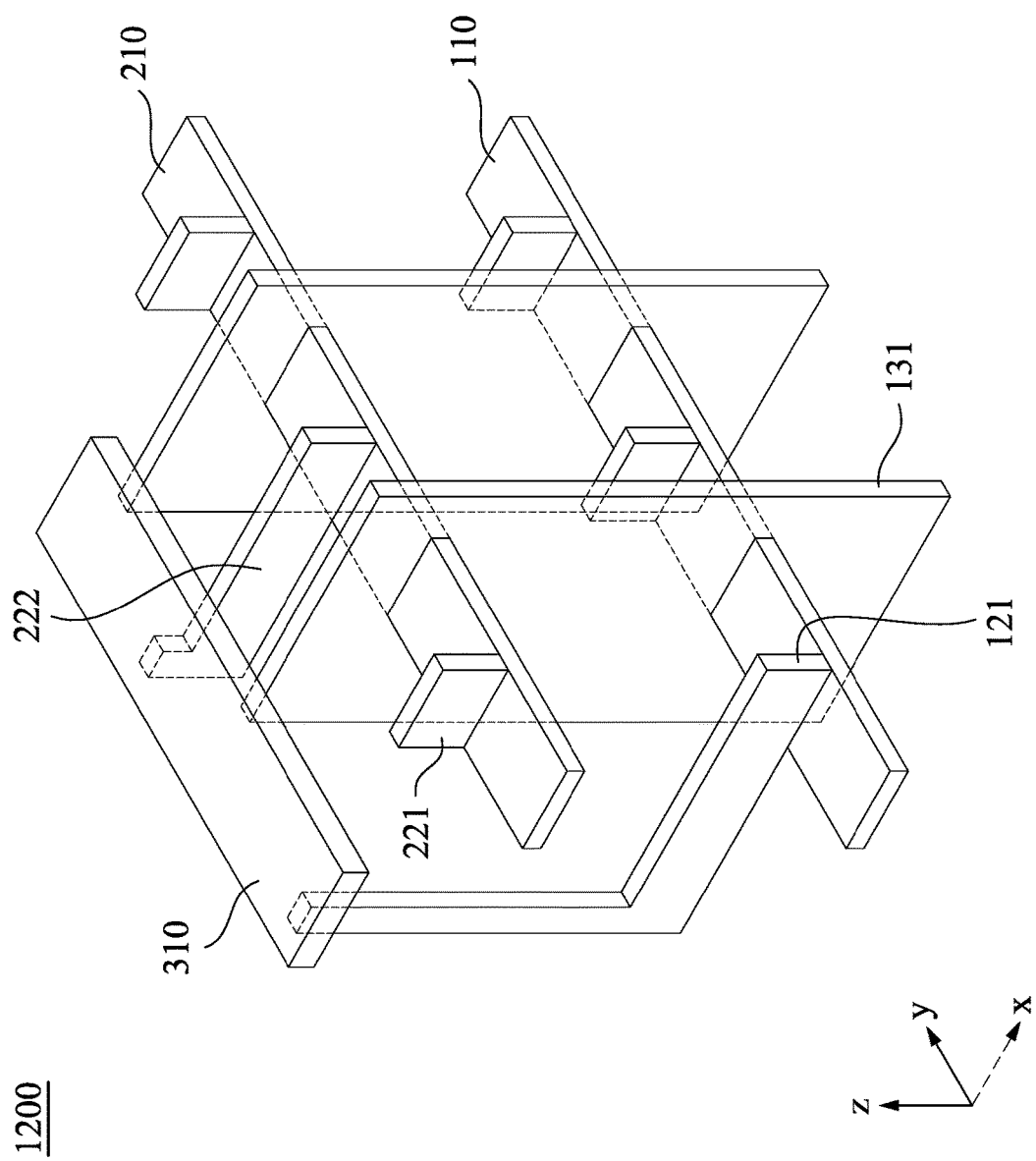
FIG. 12 is a perspective diagram of a semiconductor device, in accordance with various embodiments.

Reference is now made to FIG. 12. FIG. 12 is a perspective diagram of a semiconductor device 1200, in accordance with various embodiments. With respect to the embodiments of FIGS. 1A-11, like elements in FIG. 12 are designated with the same reference numbers for ease of understanding.

Compared with the semiconductor device 1100 of FIG. 11, instead of having the L-shaped conductive trace 310, the conductive trace 310 of the semiconductor device 1200 extends in y direction. For illustration, the conductive segment 222 includes first and second portions. The first portion extends in x direction and is coupled to the active area 210. The second portion extends in z direction and is coupled to the conductive segment 310. Alternatively stated, the conductive segment 222 is L-shaped. In some embodiments, the conductive trace 310 does not overlap the conductive segments 122 and 221 and the active areas 110 and 210.

Figure 13:
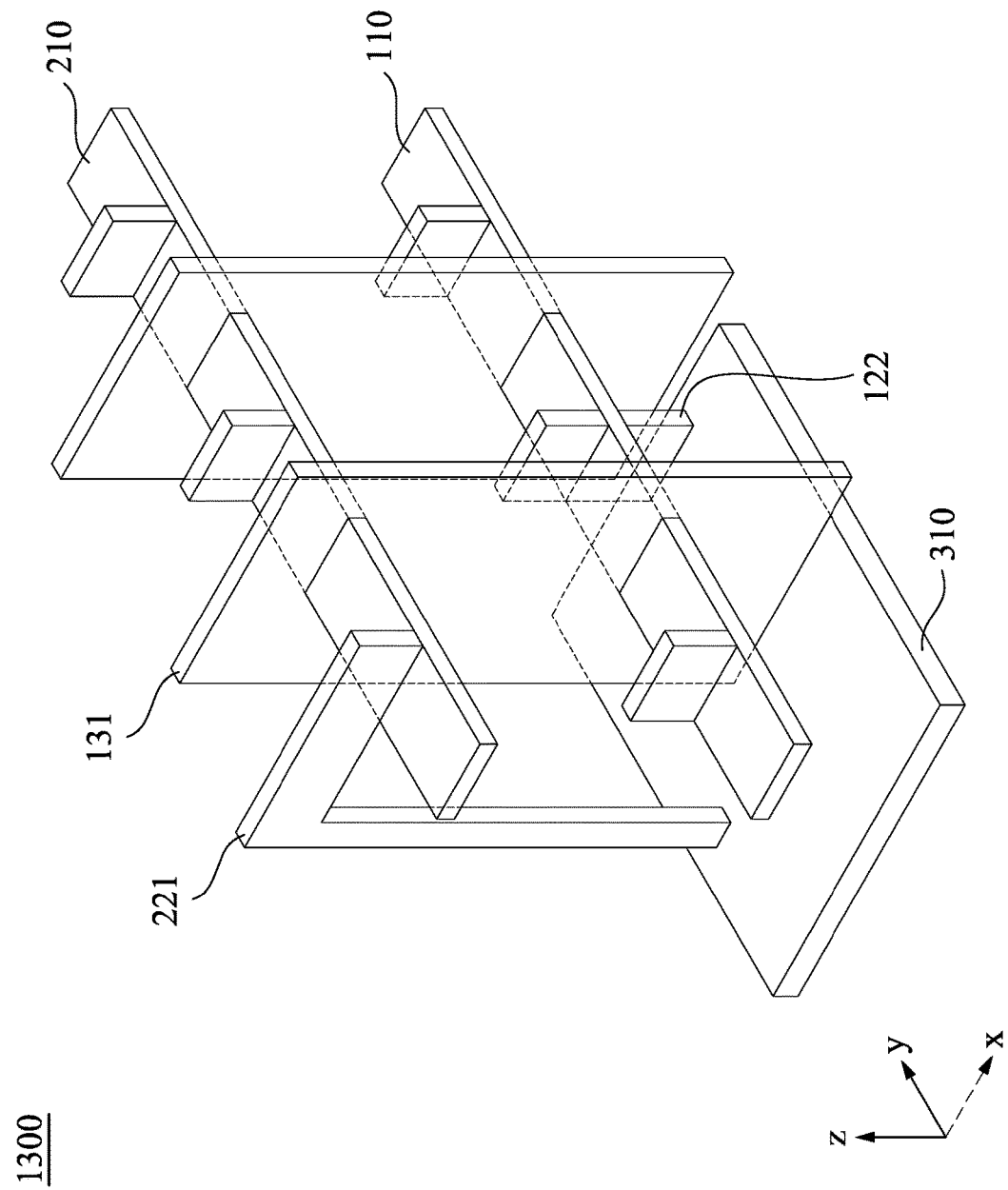
FIG. 13 is a perspective diagram of a semiconductor device, in accordance with various embodiments.

Reference is now made to FIG. 13. FIG. 13 is a perspective diagram of a semiconductor device 1300, in accordance with various embodiments. With respect to the embodiments of FIGS. 1A-12, like elements in FIG. 13 are designated with the same reference numbers for ease of understanding.

Compared with the semiconductor device 600 of FIG. 6, the conductive trace 310 is arranged below the active area 110 and the gate 131. As shown in FIG. 11, the conductive segment 122 further extends in z direction to couple to the conductive trace 310. The conductive segment 221 includes first and second portions. The first portion extends in x direction and is coupled to the active area 210. Alternatively stated, the conductive segment 221 is L-shaped. The second portion extends in z direction and is coupled to the conductive trace 310. Accordingly, the conductive trace 310 is configured to couple the conductive segment 122 to the conductive segment 221. In some embodiments, the portion of conductive segment 122 below the active area 110 is formed by extending a portion of the conductive trace 310 below the conductive segment 122 in z direction to couple to the active area 110. In various embodiments, the second portion of the conductive segment 221 is formed by extending another portion of the conductive trace 310 below the conductive segment 221 in z direction to couple to first portion of the conductive segment 221.

Figure 14:
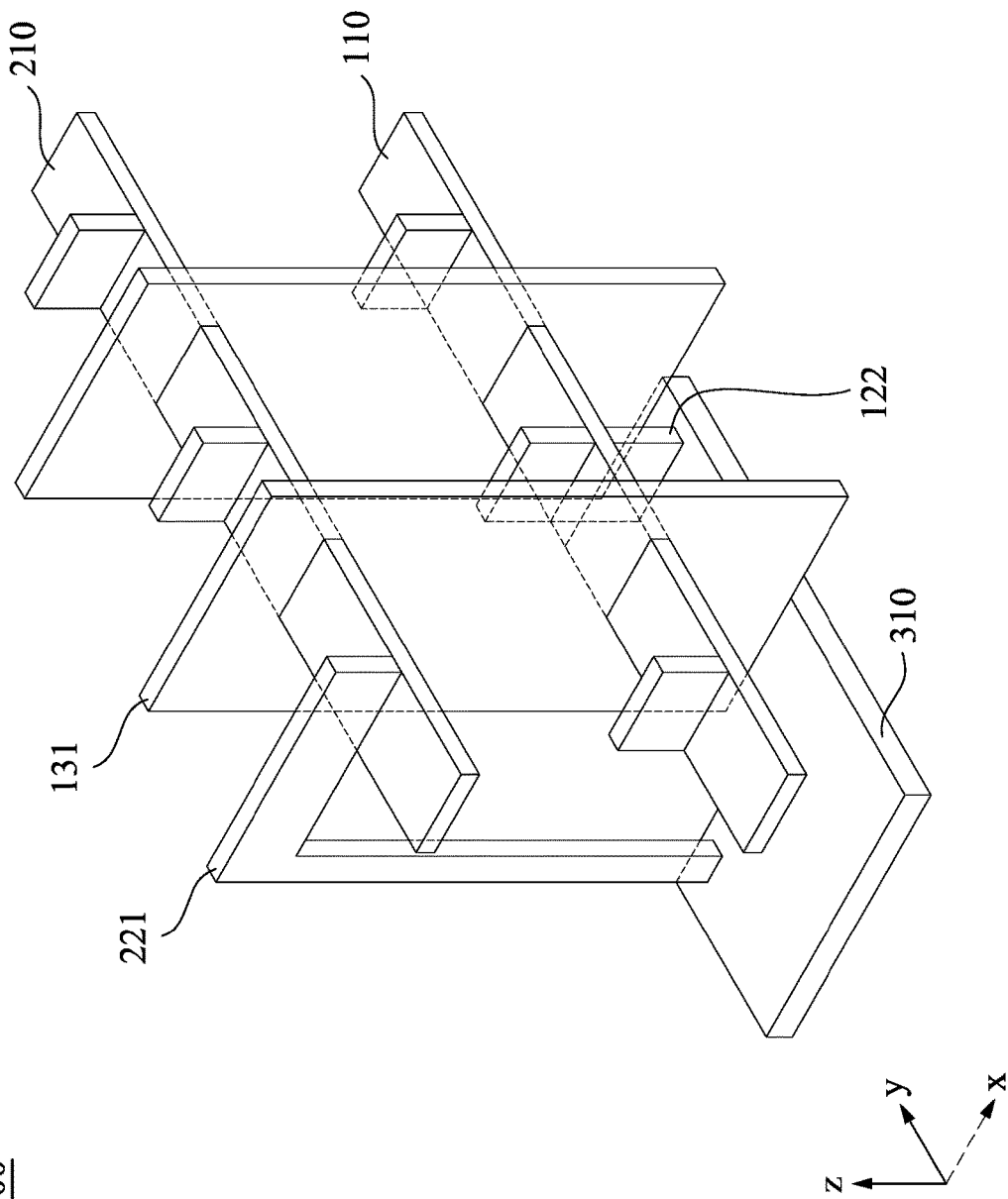
FIG. 14 is a perspective diagram of a semiconductor device, in accordance with various embodiments.

Reference is now made to FIG. 14. FIG. 14 is a perspective diagram of a semiconductor device 1400, in accordance with various embodiments. With respect to the embodiments of FIGS. 1A-13, like elements in FIG. 14 are designated with the same reference numbers for ease of understanding.

Compared with FIG. 13, instead of having the rectangle conductive trace 310 as shown in FIG. 13, the conductive trace 310 of the semiconductor device 1400 is L-shaped. For illustration, the conductive trace 310 includes first and second portions. The first portion extends in y direction and is coupled to the conductive segment 122, and the second portion extends in x direction and is coupled to the conductive segment 221. In some embodiments, the second portion of the conductive trace 310 does not overlap the conductive segment 122 and the gate 131.

Figure 15:
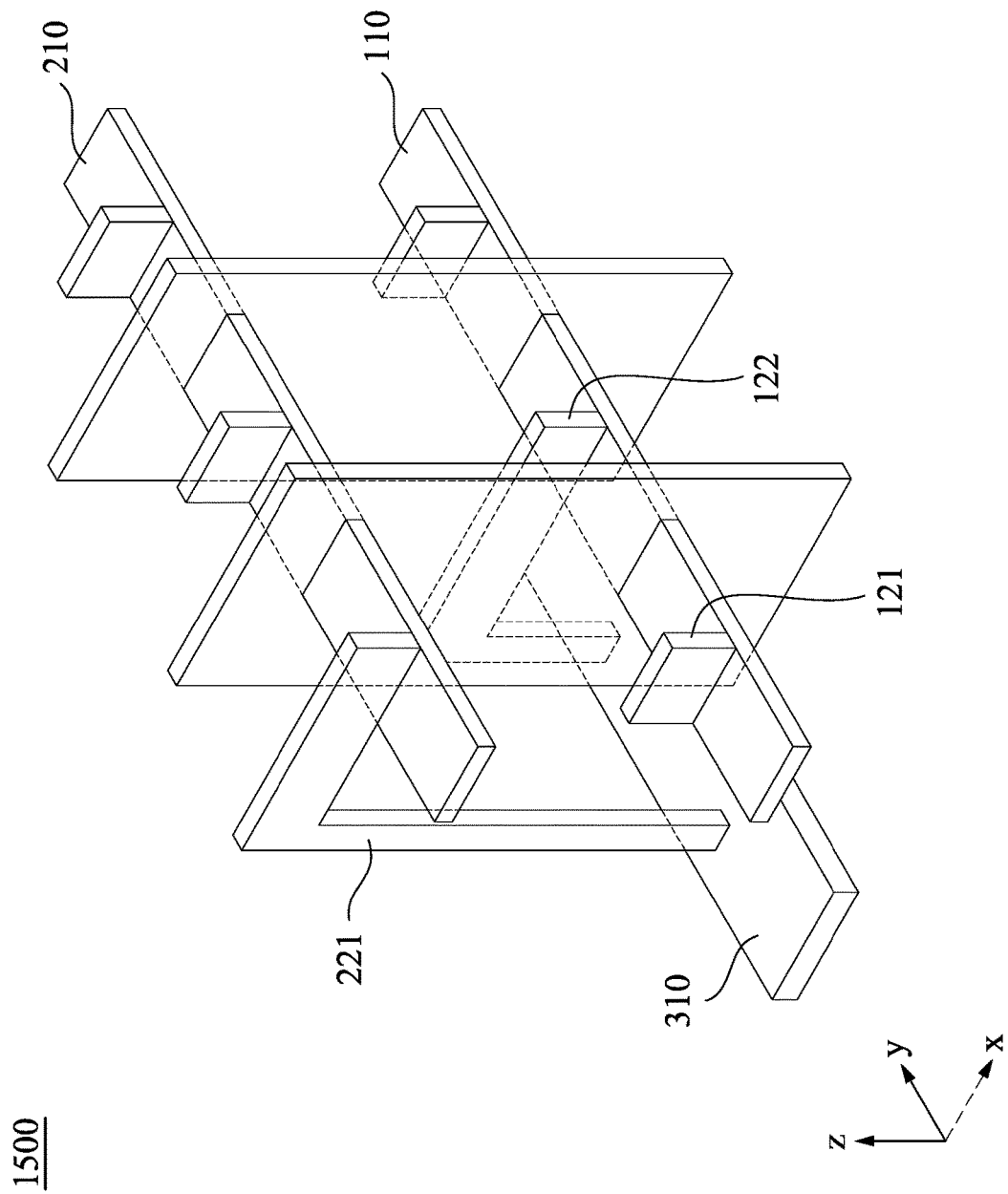
FIG. 15 is a perspective diagram of a semiconductor device, in accordance with various embodiments.

Reference is now made to FIG. 15. FIG. 15 is a perspective diagram of a semiconductor device 1500, in accordance with various embodiments. With respect to the embodiments of FIGS. 1A-14, like elements in FIG. 15 are designated with the same reference numbers for ease of understanding.

Compared with the semiconductor device 1400 of FIG. 14, instead of having the L-shaped conductive trace 310, the conductive trace 310 of the semiconductor device 1500 extends in y direction. For illustration, the conductive segment 122 includes first and second portions. The first portion extends in x direction and is coupled to the active area 110. The second portion extends in z direction and is coupled to the conductive trace 310. In some embodiments, the conductive trace 310 does not overlap the conductive segments 121 and 222 and the active areas 110 and 210. In some embodiments, the second portion of the conductive segment 122 is formed by extending a portion of the conductive trace 310 below the conductive segment 122 in z direction to be coupled to the conductive segment 122.

Figure 16A:
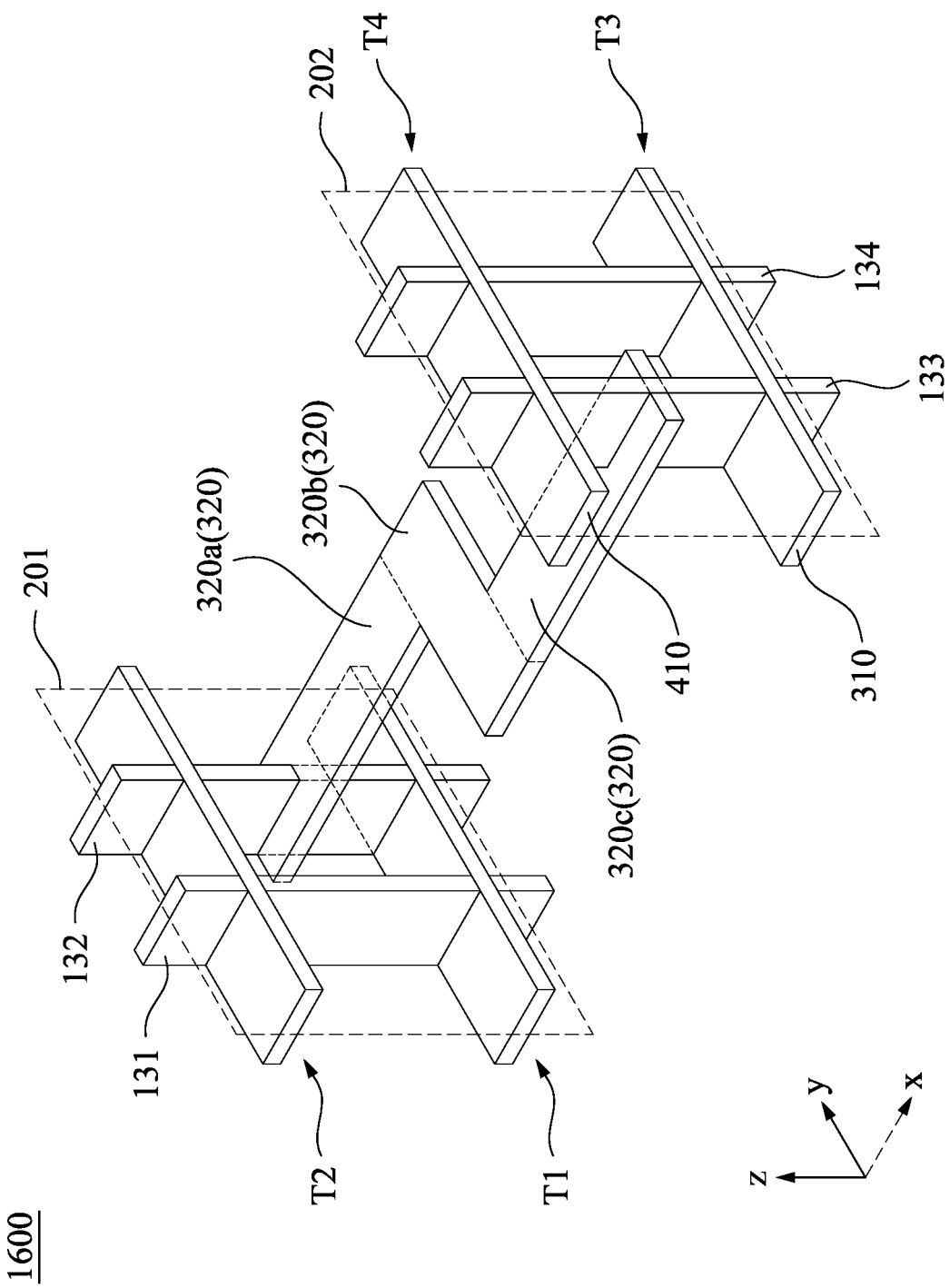
FIG. 16A is a perspective diagram of a semiconductor device.

Reference is now made to FIG. 16A. FIG. 16A is a perspective diagram of a semiconductor device 1600, in accordance with various embodiments. With respect to the embodiments of FIGS. 1A-15, like elements in FIG. 16A are designated with the same reference numbers for ease of understanding.

Compared with FIG. 1A, the semiconductor device 1600 further includes transistors T3-T4. For illustration, the transistor T4 is disposed above the transistor T3. In some embodiments, the transistor T3 is separated from the transistor T1 in x direction. Furthermore, in some embodiments, the transistors T1-T2 are arranged in a vertical plan 201, and the transistors T3-T4 are arranged in a vertical plan 202 parallel to and apart from the vertical plan 201. In the embodiments of FIG. 16A, the gates 131-132 have a smaller width compared with the gates 131-132 of FIG. 1A.

As shown in FIG. 16A, the transistors T3-T4 include active areas 310 and 410 respectively. The active areas 310 and 410 extend in y direction, and the active area 410 is arranged above the active area 310. The transistors T3-T4 share gates 133-134. The gates 133-134 extend in z direction and are separated from each other in y direction. In some embodiments, the active areas 310 and 410 are configured with respect to, for example, the active areas 110 and 210. The gates 133-134 are configured with respect to, for example, the gates 131-132.

For illustration, the semiconductor device 1600 further includes a conductive trace 320 in the layer 103 which is located between, for example, the active areas 110 and 210. In some embodiments, the conductive trace 320 is configured with respect to, for example, the conductive trace 310. Specifically, the conductive trace 320 includes three portions 320a-320c. The portions 320a and 320c extend in x direction while the portion 320b extends in y direction. The portions 320a and 320c are coupled to the gates 132 and 133 respectively. Accordingly, the gates 132-133 are coupled to each other through the portions 320a-320c. Alternatively stated, the conductive trace 320 is configured to couple gates of two transistors separated from each other in x or y direction. In some embodiments, the gate 132 is embedded in the portion 320a, and the gate 133 is embedded in the portion 320c, as shown in FIG. 16A.

The configurations of FIG. 16A are given for illustrative purposes. Various implements are within the contemplated scope of the present disclosure. For example, in some embodiments, the conductive trace 320 is arranged above the active areas 210 and 410. In various embodiments, the conductive trace 320 is arranged below the active areas 110 and 310.

Figure 16B:
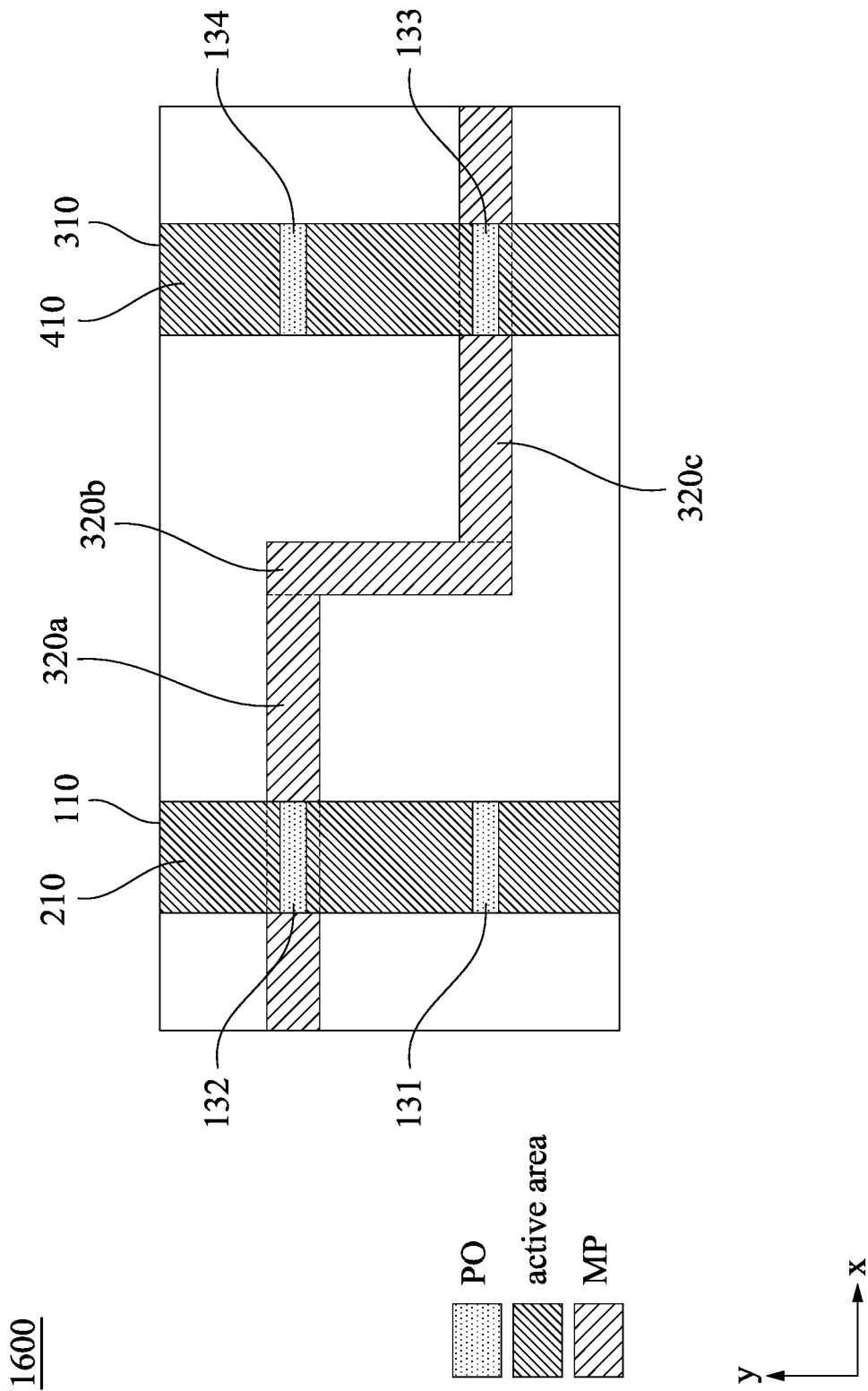
FIG. 16B is a layout diagram in a plan view of part of the semiconductor device of FIG. 16A, in accordance with various embodiments.

Reference is now made to FIG. 16B. FIG. 16B is a layout diagram in a plan view of part of the semiconductor device 1600 of FIG. 16A. With respect to the embodiments of FIGS. 1A-16A, like elements in FIG. 16B are designated with the same reference numbers for ease of understanding.

As shown in FIG. 16B, in the layout view, the portion 320a of the conductive trace 320 overlaps the active areas 110 and 210 and the gate 132. The portion 320c of the conductive trace 320 overlaps the active areas 310 and 410 and the gate 133. Alternatively stated, the conductive trace 320 overlaps the active areas 110, 210, 310, and 410, and the gates 132-133.

Figure 17A:
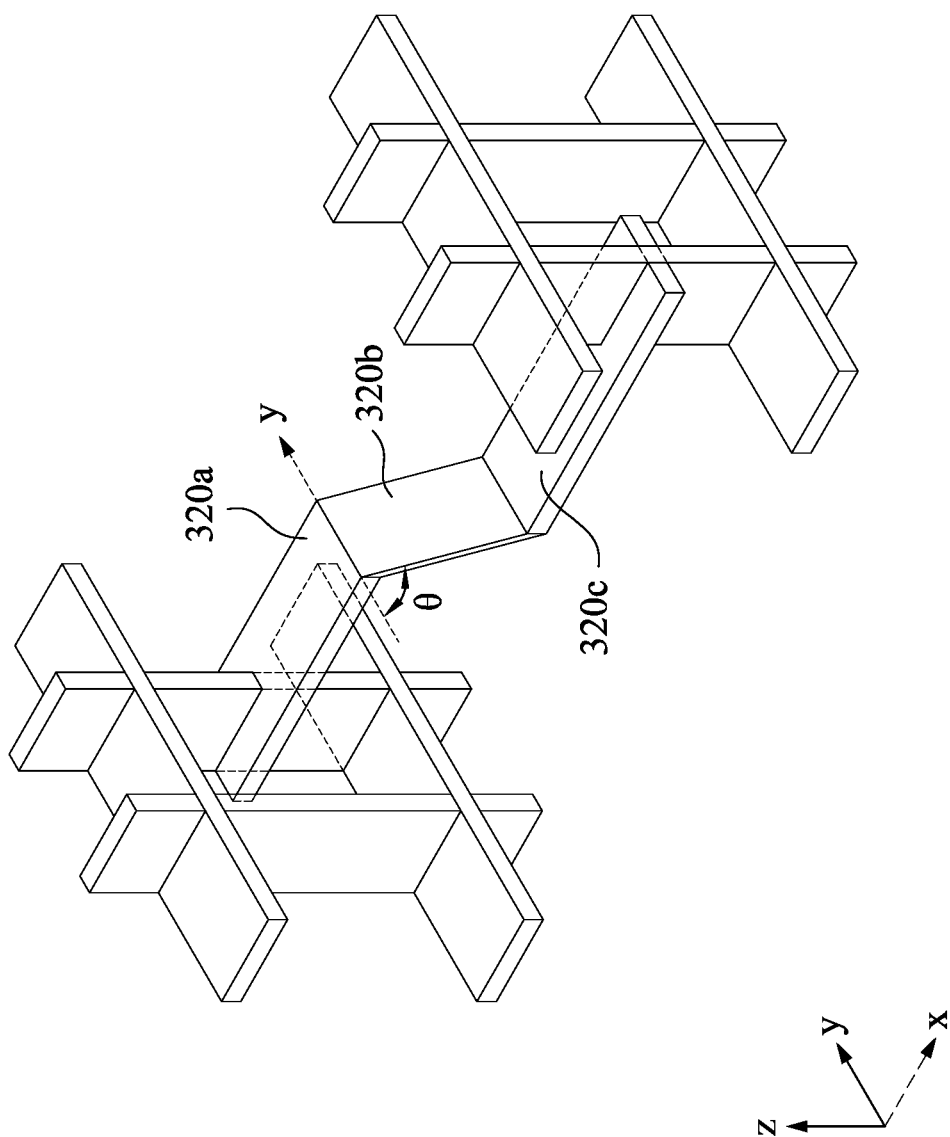
FIG. 17A is a perspective diagram of a semiconductor device.

Reference is now made to FIG. 17A. FIG. 17A is a perspective diagram of a semiconductor device 1700, in accordance with various embodiments. With respect to the embodiments of FIGS. 1A-16, like elements in FIG. 17A are designated with the same reference numbers for ease of understanding.

Compared with the semiconductor device 1600 of FIG. 16A, instead of the portion 320b extending in y direction as shown in FIG. 16A, the portion 320b of the conductive trace 320 in the semiconductor 1700 of FIG. 17A extends in a direction which makes an angle θ with y direction. Alternatively stated, the direction in which the portion 320b extending is different from x, y direction.

Figure 17B:
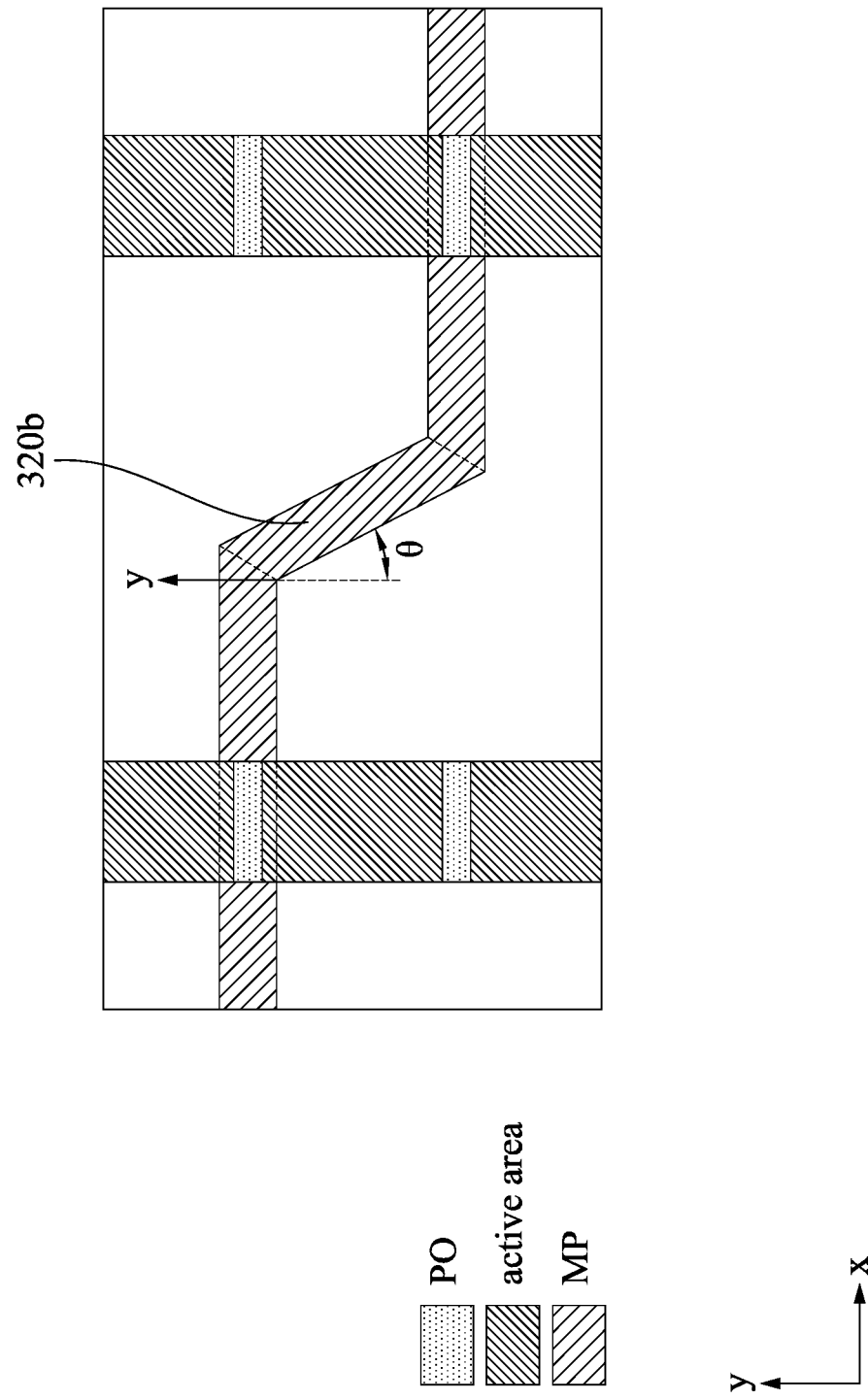
FIG. 17B is a layout diagram in a plan view of part of the semiconductor device of FIG. 17A, in accordance with various embodiments.

Reference is now made to FIG. 17B. FIG. 17B is a layout diagram in a plan view of part of the semiconductor device 1700 of FIG. 17A. With respect to the embodiments of FIGS. 1A-17A, like elements in FIG. 17B are designated with the same reference numbers for ease of understanding.

Compared with FIG. 16B, the portion 320b of the conductive trace 320 extends with the angle θ from the y direction.

Figure 18A:
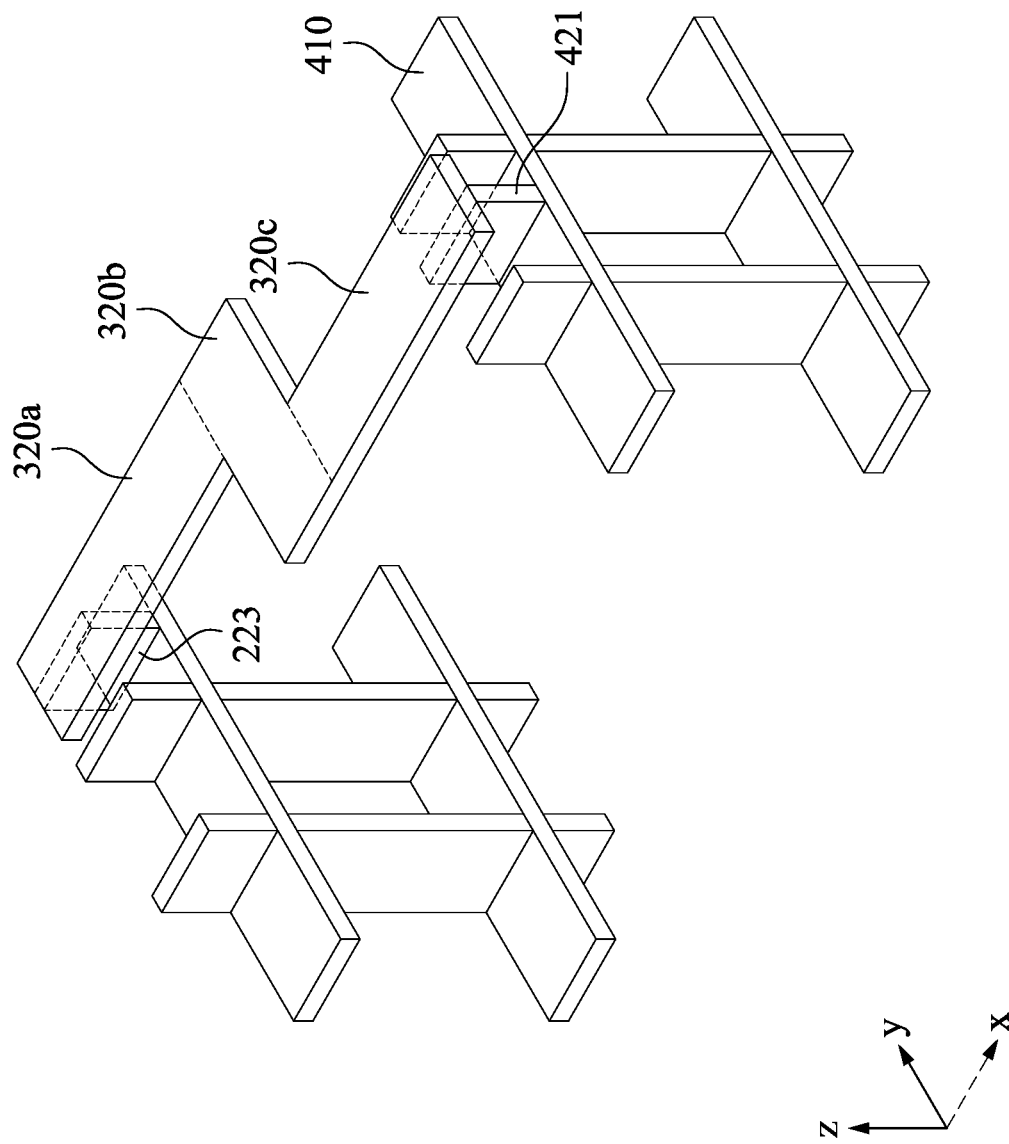
FIG. 18A is a perspective diagram of a semiconductor device.

Reference is now made to FIG. 18A. FIG. 18A is a perspective diagram of a semiconductor device 1800, in accordance with various embodiments. With respect to the embodiments of FIGS. 1A-17B, like elements in FIG. 18A are designated with the same reference numbers for ease of understanding.

Compared with FIG. 16A, the conductive trace 320 is arranged above the active areas 210 and 410. The transistor T4 of the semiconductor device 1800 further includes a conductive segment 421 disposed on the active area 410. As shown in FIG. 18A, the portion 320a is arranged above and coupled to the conductive segment 223. The portion 320c is arranged above and coupled to the conductive segment 421. Accordingly, the conductive segments 223 and 421 are coupled together through the conductive trace 320. Alternatively stated, the conductive trace 320 is configured to couple conductive segments of two separated transistors.

The configurations of FIG. 18A are given for illustrative purposes. Various implements are within the contemplated scope of the present disclosure. For example, in some embodiments, the conductive trace 320 is arranged between the active areas 110, 210, 310, and 410 to couple other conductive segments disposed on the active areas 110 and 310.

Figure 18B:
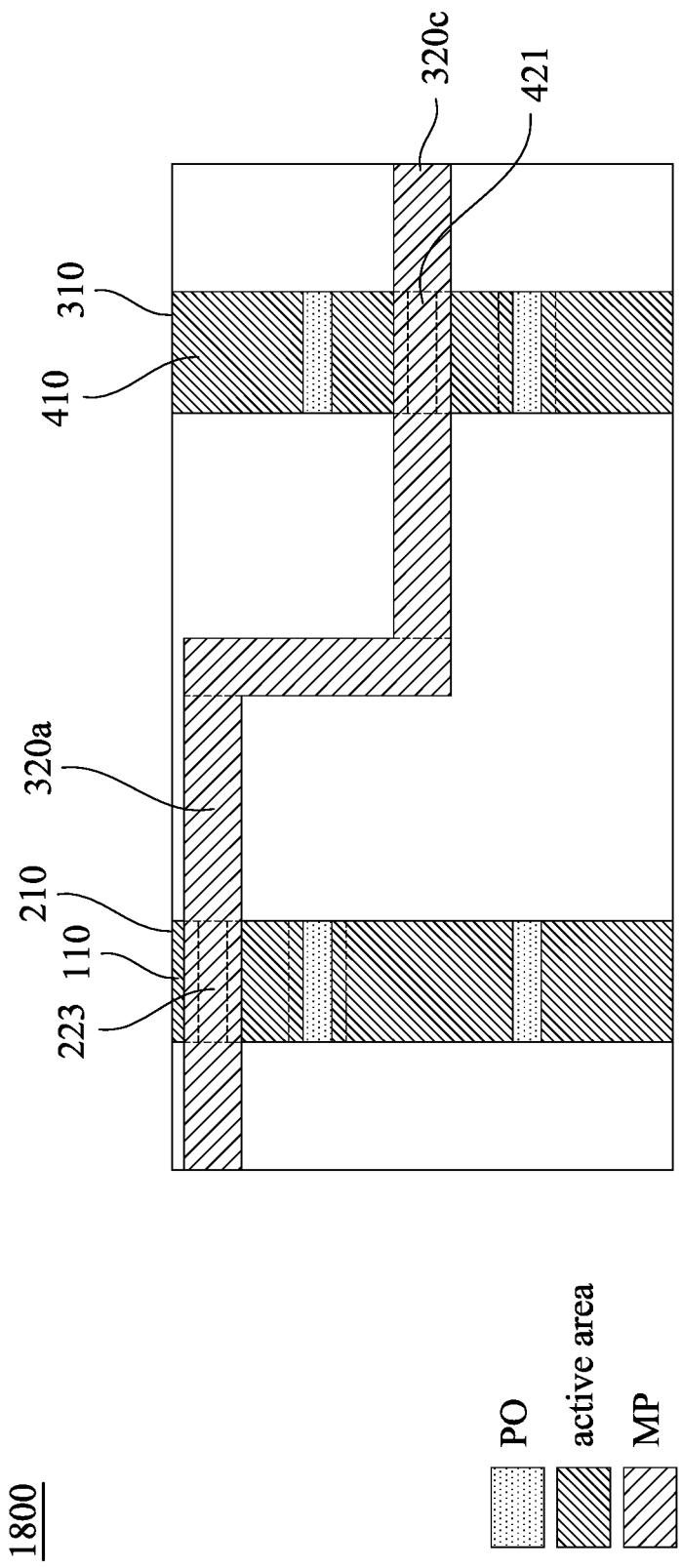
FIG. 18B is a layout diagram in a plan view of part of the semiconductor device of FIG. 18A, in accordance with various embodiments.

Reference is now made to FIG. 18B. FIG. 18B is a layout diagram in a plan view of part of the semiconductor device 1800 of FIG. 18A. With respect to the embodiments of FIGS. 1A-18A, like elements in FIG. 18B are designated with the same reference numbers for ease of understanding.

Compared with FIG. 16B, the portion 320a overlaps the conductive segment 223, and the portion 320c overlaps the conductive segment 421. Alternatively stated, the conductive trace 320 further overlaps the conductive segments 223 and 421.

Figure 19A:
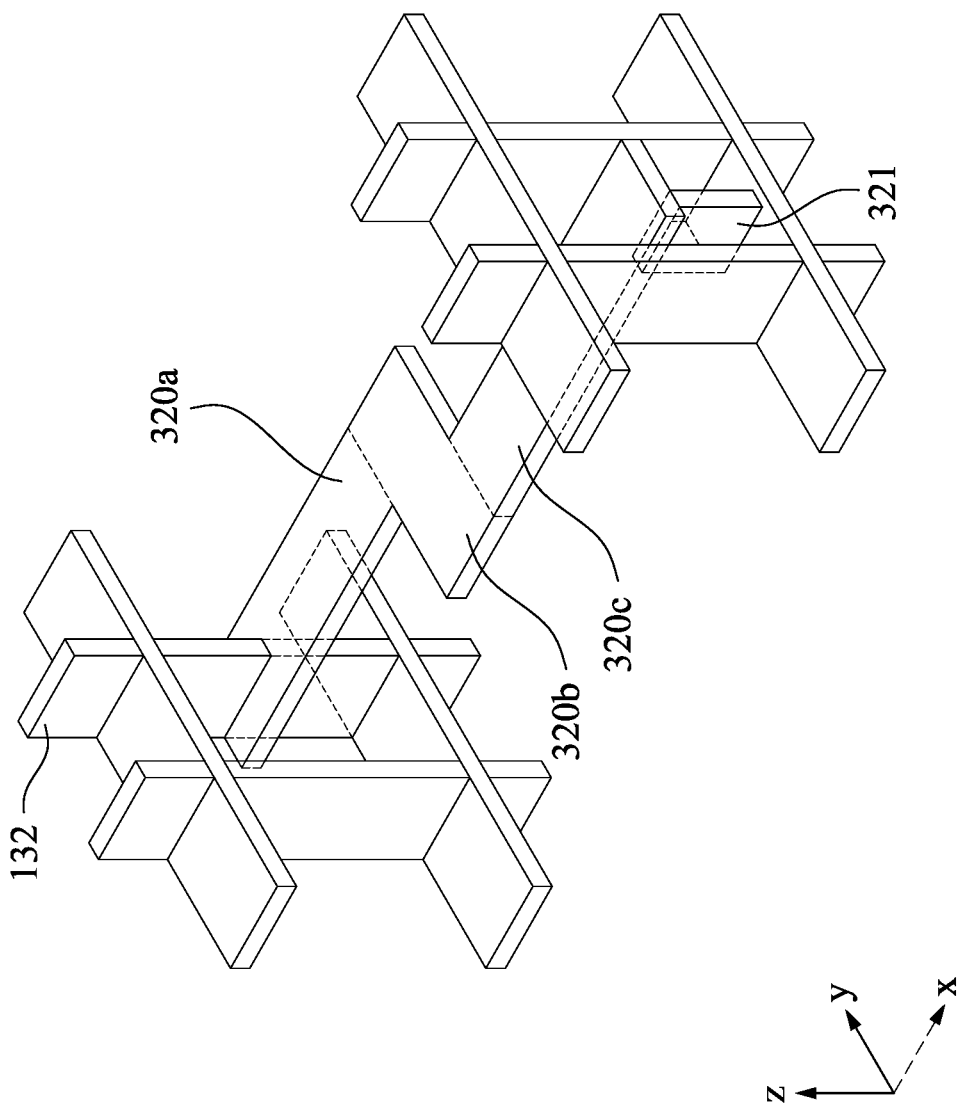
FIG. 19A is a perspective diagram of a semiconductor device.

Reference is now made to FIG. 19A. FIG. 19A is a perspective diagram of a semiconductor device 1900, in accordance with various embodiments. With respect to the embodiments of FIGS. 1A-18B, like elements in FIG. 19A are designated with the same reference numbers for ease of understanding.

Compared with FIG. 16A, the transistor T3 further includes a conductive segments 321 on the active area 310. Instead of the portion 320c of the conductive trace 320 being coupled to the gate 133, the portion 320c of the semiconductor device 1900 is further coupled to the conductive segment 321. Accordingly, the gate 132 is coupled to the conductive segment 321. Alternatively stated, the conductive trace 320 is configured to couple a gate of a first transistor and a conductive segment of a second transistor separated from the first transistor.

Figure 19B:
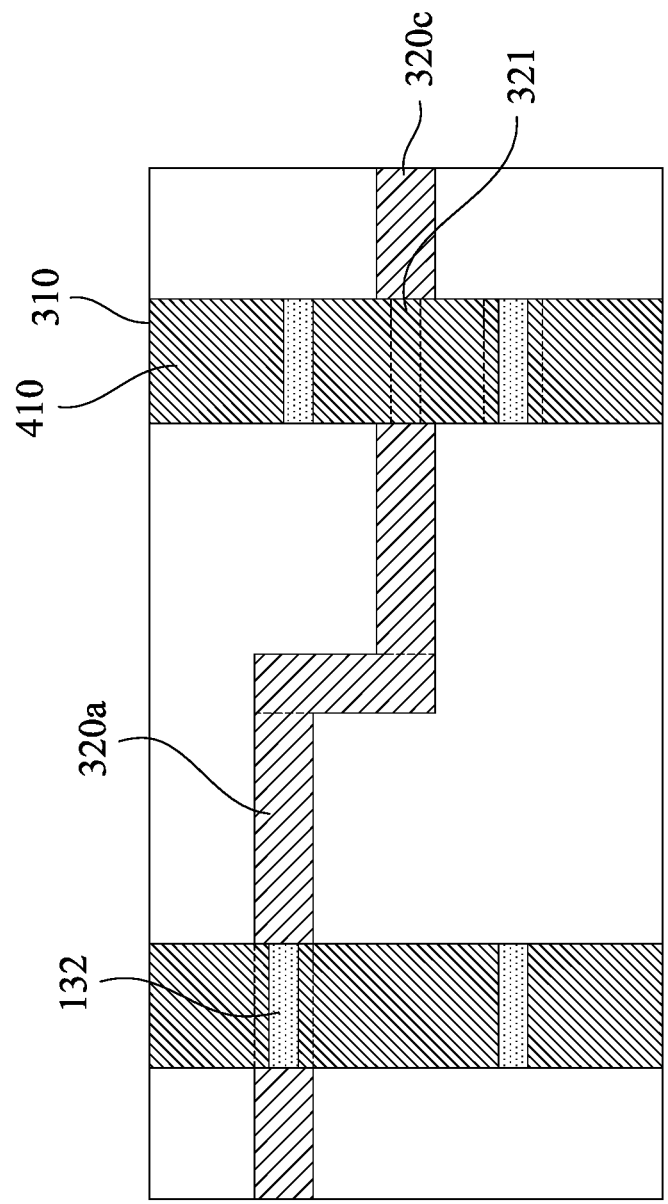
FIG. 19B is a layout diagram in a plan view of part of the semiconductor device of FIG. 19A, in accordance with various embodiments.

Reference is now made to FIG. 19B. FIG. 19B is a layout diagram in a plan view of part of the semiconductor device 1900 of FIG. 19A. With respect to the embodiments of FIGS. 1A-19A, like elements in FIG. 19B are designated with the same reference numbers for ease of understanding.

Compared with FIG. 16B, the portion 320c of the conductive trace 320 overlaps the conductive segment 321 instead of overlapping the gate 133. Alternatively stated, the conductive trace 320 overlaps the gate of the first transistor and the conductive segment of the second transistor in the layout view.

Figure 20:
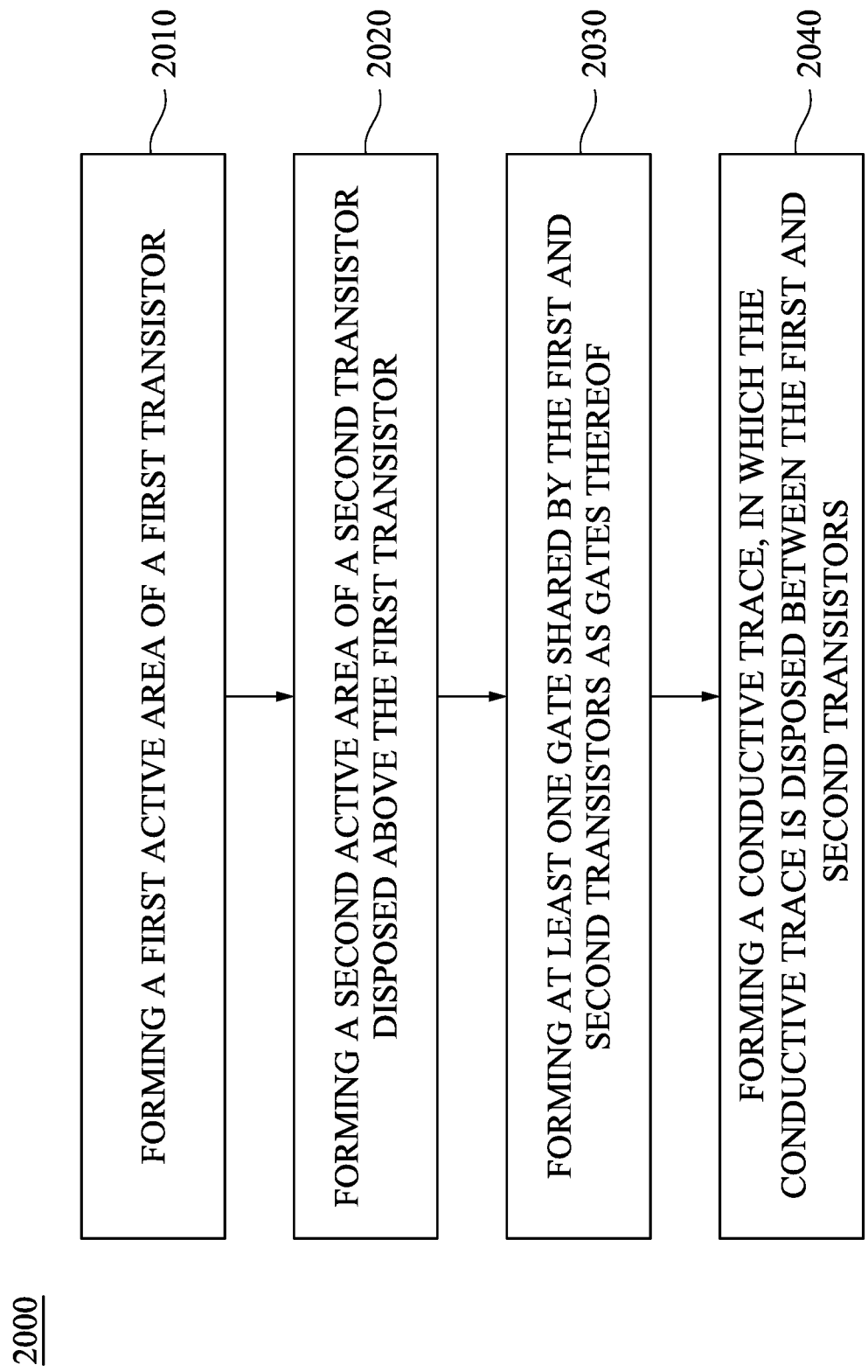
FIG. 20 is a flow chart of a method of fabricating a semiconductor device, in accordance with some embodiments of the present disclosure.

Reference is now made to FIG. 20. FIG. 20 is a flow chart of a method 2000 of fabricating the semiconductor device 100, 200, 300, 400, 500, 600, 700, 800, 900, 1000, 1100, 1200, 1300, 1400, 1500, 1600, 1700, 1800, or 1900, in accordance with some embodiments of the present disclosure. It is understood that additional operations can be provided before, during, and after the processes shown by FIG. 20, and some of the operations described below can be replaced or eliminated, for additional embodiments of the method. The order of the operations/processes may be interchangeable. Throughout the various views and illustrative embodiments, like reference numbers are used to designate like elements. The method 2000 will be discussed with reference to FIGS. 1A-1B and 16A-16B.

In operation 2010, the active area 110 of the transistor T1 is formed, as shown in FIG. 1A. In some embodiments, the active area 110 extends in y direction on the layer 101.

In operation 2020, the active area 210 of the transistor T2 is formed. The transistor T2 is disposed above the transistor T1 in z direction. In some embodiments, the active area 210 extends in y direction on the layer 102, as shown in FIG. 1A.

In some embodiments, as shown in FIG. 1A, the conductive segments 121-122 are formed on the active area 110, and the conductive segments 221-222 are formed on the active area 210. In some embodiments, as shown FIG. 1B, the conductive segments 221-222 and the conductive trace 310 overlap in the layout view.

In operation 2030, the gate 131 is formed. The gate 131 extends in z direction. In some embodiments, the gate 131 is shared by the transistors T1-T2 as gates. In some embodiments, the transistors T1-T2 further share the gate 132 and are located in the vertical plan 201, as shown in FIG. 16A.

In operation 2040, the conductive trace 310 is formed. In some embodiments, as shown in FIG. 1B, the active areas 110, 210, the gate 131, and the conductive trace 310 overlap in the layout view. The conductive trace 310 is disposed between the transistors T1-T2. In some embodiments, the conductive trace 310 has the width W2 larger than the width W1 of the active areas 110 and 210.

In some embodiments, the method 2000 further includes forming the active area 310 of the transistor T3 and the active area 410 of the transistor T4, as shown in FIG. 16A. In some embodiments, the transistors T3-T4 are arranged in the vertical plan 202 parallel to the vertical plan 201.

In some embodiments, the conductive trace 320 is formed and includes the portions 320a-320c. As shown in FIG. 16B, the portion 320a overlaps the active areas 110 and 210, and the portion 320c overlaps the active areas 310 and 410. Alternatively stated, the conductive trace 320 overlaps the active areas 110, 210, 310, and 410 in the layout view.

Figure 21:
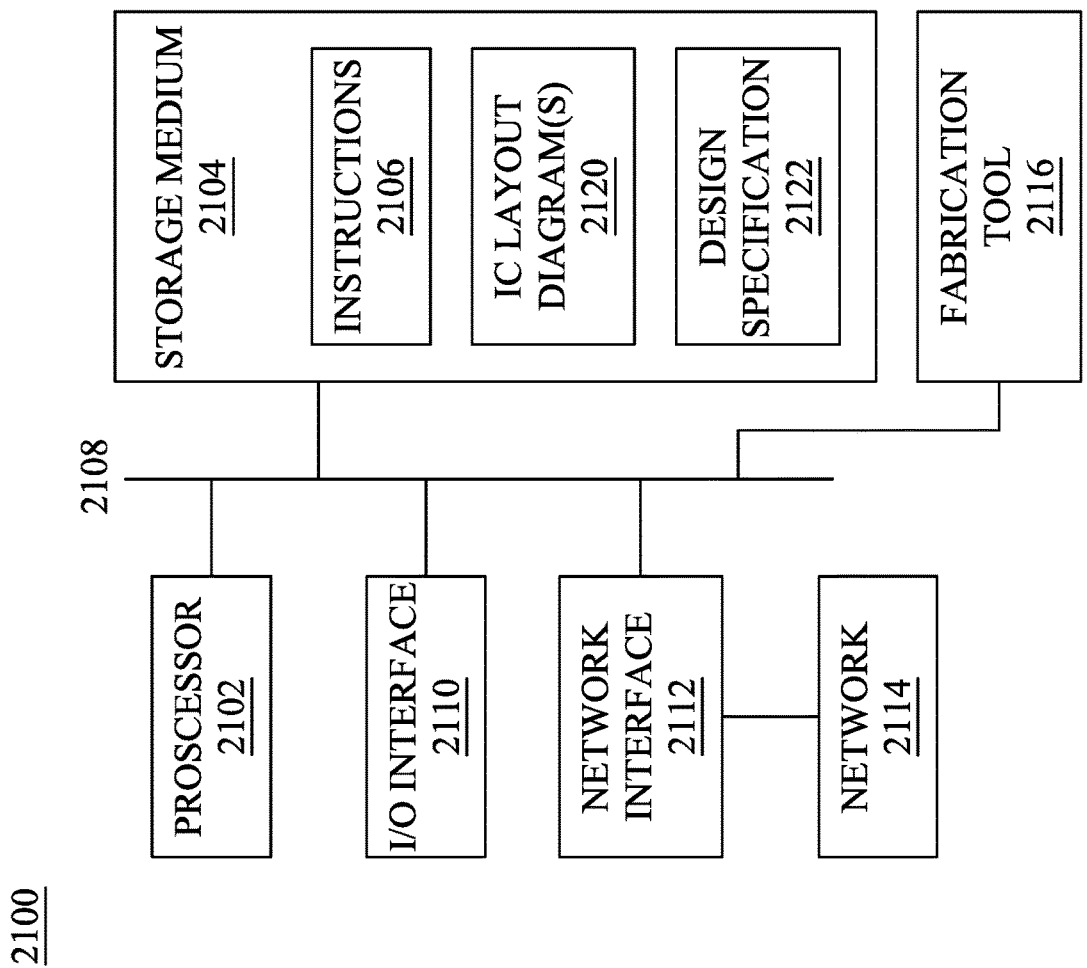
FIG. 21 is a block diagram of a system for designing the integrated circuit layout design, in accordance with some embodiments of the present disclosure.

Reference is now made to FIG. 21. FIG. 21 is a block diagram of electronic design automation (EDA) system 2100 for designing the integrated circuit layout design, in accordance with some embodiments of the present disclosure. EDA system 2100 is configured to implement one or more operations of the method 2000 disclosed in FIG. 20, and further explained in conjunction with FIGS. 1A-19B. In some embodiments, EDA system 2100 includes an APR system.

In some embodiments, EDA system 2100 is a general purpose computing device including a hardware processor 2102 and a non-transitory, computer-readable storage medium 2104. Storage medium 2104, amongst other things, is encoded with, i.e., stores, computer program code (instructions) 2106, i.e., a set of executable instructions. Execution of instructions 2106 by hardware processor 2102 represents (at least in part) an EDA tool which implements a portion or all of, e.g., the method 2000.

The processor 2102 is electrically coupled to computer-readable storage medium 2104 via a bus 2108. The processor 2102 is also electrically coupled to an I/O interface 2121 and a fabrication tool 2116 by bus 2108. A network interface 2112 is also electrically connected to processor 2102 via bus 2108. Network interface 2112 is connected to a network 2114, so that processor 2102 and computer-readable storage medium 2104 are capable of connecting to external elements via network 2114. The processor 2102 is configured to execute computer program code 2106 encoded in computer-readable storage medium 2104 in order to cause EDA system 2100 to be usable for performing a portion or all of the noted processes and/or methods. In one or more embodiments, processor 2102 is a central processing unit (CPU), a multi-processor, a distributed processing system, an application specific integrated circuit (ASIC), and/or a suitable processing unit.

In one or more embodiments, computer-readable storage medium 2104 is an electronic, magnetic, optical, electromagnetic, infrared, and/or a semiconductor system (or apparatus or device). For example, computer-readable storage medium 2104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 2104 includes a compact disk-read only memory (CD-ROM), a compact disk-read/write (CD-R/W), and/or a digital video disc (DVD).

In one or more embodiments, storage medium 2104 stores computer program code 2106 configured to cause EDA system 2100 (where such execution represents (at least in part) the EDA tool) to be usable for performing a portion or all of the noted processes and/or methods. In one or more embodiments, storage medium 2104 also stores information which facilitates performing a portion or all of the noted processes and/or methods. In one or more embodiments, storage medium 2104 stores IC layout diagram 2120 of standard cells including such standard cells as disclosed herein, for example, a cell including in the semiconductor devices 100, 200, 300, 400, 500, 600, 700, 800, 900, 1000, 1100, 1200, 1300, 1400, 1500, 1600, 1700, 1800, or 1900 discussed above with respect to FIGS. 1A-19B.

EDA system 2100 includes I/O interface 2121. I/O interface 2121 is coupled to external circuitry. In one or more embodiments, I/O interface 2121 includes a keyboard, keypad, mouse, trackball, trackpad, touchscreen, and/or cursor direction keys for communicating information and commands to processor 2102.

EDA system 2100 also includes network interface 2112 coupled to processor 2102. Network interface 2112 allows EDA system 2100 to communicate with network 2114, to which one or more other computer systems are connected. Network interface 2112 includes wireless network interfaces such as BLUETOOTH, WIFI, WIMAX, GPRS, or WCDMA; or wired network interfaces such as ETHERNET, USB, or IEEE-2164. In one or more embodiments, a portion or all of noted processes and/or methods are implemented in two or more systems 2100.

EDA system 2100 also includes the fabrication tool 2116 coupled to processor 2102. The fabrication tool 2116 is configured to fabricate integrated circuits or semiconductor device, e.g., the semiconductor devices 100, 200, 300, 400, 500, 600, 700, 800, 900, 1000, 1100, 1200, 1300, 1400, 1500, 1600, 1700, 1800, or 1900 discussed above with respect to FIGS. 1A-19B, according to the design files processed by the processor 2102.

EDA system 2100 is configured to receive information through I/O interface 2121. The information received through I/O interface 2121 includes one or more of instructions, data, design rules, libraries of standard cells, and/or other parameters for processing by processor 2102. The information is transferred to processor 2102 via bus 2108. EDA system 2100 is configured to receive information related to a UI through I/O interface 2121. The information is stored in computer-readable medium 2104 as design specification 2122.

In some embodiments, a portion or all of the noted processes and/or methods are implemented as a standalone software application for execution by a processor. In some embodiments, a portion or all of the noted processes and/or methods are implemented as a software application that is a part of an additional software application. In some embodiments, a portion or all of the noted processes and/or methods are implemented as a plug-in to a software application. In some embodiments, at least one of the noted processes and/or methods are implemented as a software application that is a portion of an EDA tool. In some embodiments, a portion or all of the noted processes and/or methods are implemented as a software application that is used by EDA system 2100. In some embodiments, a layout diagram which includes standard cells is generated using a suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 22:
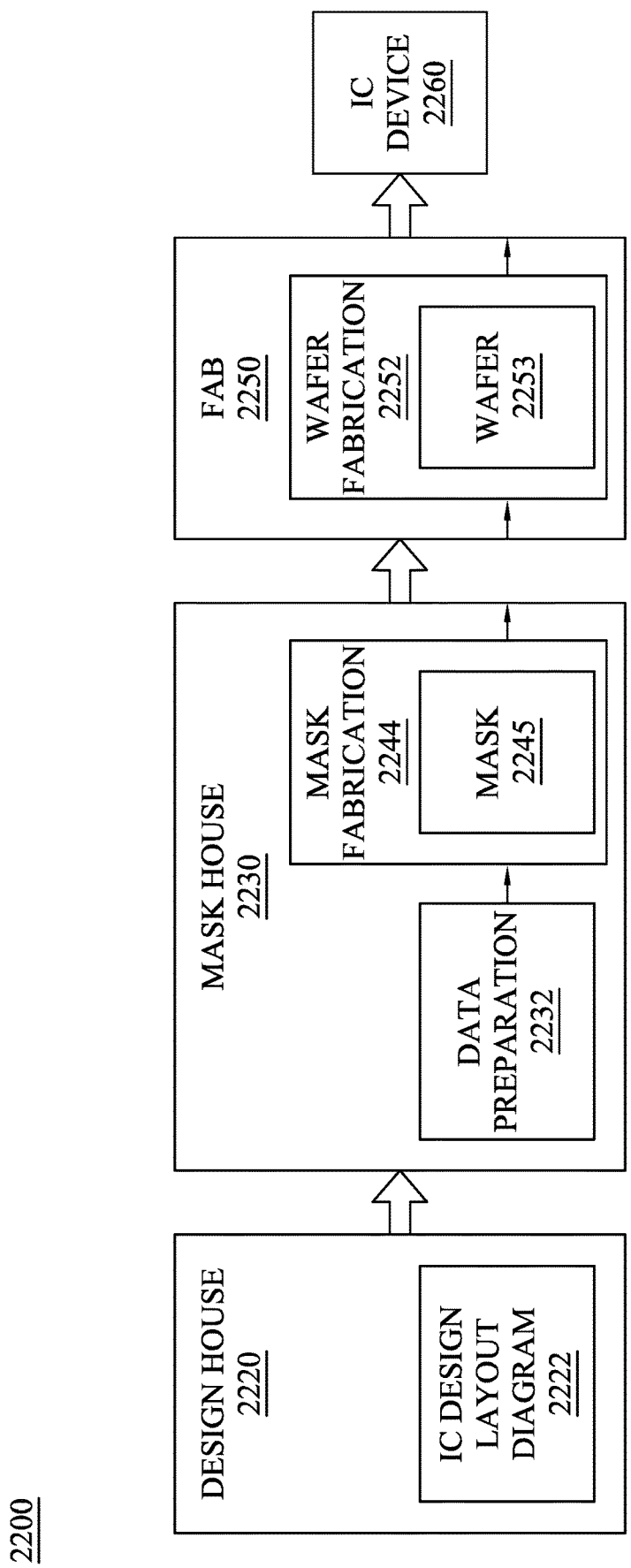
FIG. 22 is a block diagram of an integrated circuit manufacturing system, and an integrated circuit manufacturing flow associated therewith, in accordance with some embodiments.

FIG. 22 is a block diagram of IC manufacturing system 2200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 2200.

In FIG. 22, IC manufacturing system 2200 includes entities, such as a design house 2220, a mask house 2230, and an IC manufacturer/fabricator ("fab") 2250, that interact with one another in the design, development, and manufacturing cycles and/or services related to manufacturing an IC device 2260. The entities in IC manufacturing system 2200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 2220, mask house 2230, and IC fab 2250 is owned by a single entity. In some embodiments, two or more of design house 2220, mask house 2230, and IC fab 2250 coexist in a common facility and use common resources.

Design house (or design team) 2220 generates an IC design layout diagram 2222. IC design layout diagram 2222 includes various geometrical patterns, for example, an IC layout design depicted in FIGS. 1C, 3C, 4B, 5B, 16B, 17B, 18B, and/or 19B, designed for an IC device 2260, for example, the semiconductor devices 100, 200, 300, 400, 500, 600, 700, 800, 900, 1000, 1100, 1200, 1300, 1400, 1500, 1600, 1700, 1800, or 1900 illustrated in FIGS. 1A-19B. The geometrical patterns correspond to patterns of metal, oxide, or semiconductor layers that make up the various components of IC device 2260 to be fabricated. The various layers combine to form various IC features. For example, a portion of IC design layout diagram 2222 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 2220 implements a proper design procedure to form IC design layout diagram 2222. The design procedure includes one or more of logic design, physical design or place and route. IC design layout diagram 2222 is presented in one or more data files having information of the geometrical patterns. For example, IC design layout diagram 2222 can be expressed in a GDSII file format or DFII file format.

Mask house 2230 includes data preparation 2232 and mask fabrication 2244. Mask house 2230 uses IC design layout diagram 2222 to manufacture one or more masks 2245 to be used for fabricating the various layers of IC device 2260 according to IC design layout diagram 2222. Mask house 2230 performs mask data preparation 2232, where IC design layout diagram 2222 is translated into a representative data file ("RDF"). Mask data preparation 2232 provides the RDF to mask fabrication 2244. Mask fabrication 2244 includes a mask writer. A mask writer converts the RDF to an image on a substrate, such as a mask (reticle) 2245 or a semiconductor wafer 2253. The IC design layout diagram 2222 is manipulated by mask data preparation 2232 to comply with particular characteristics of the mask writer and/or requirements of IC fab 2250. In FIG. 22, data preparation 2232 and mask fabrication 2244 are illustrated as separate elements. In some embodiments, data preparation 2232 and mask fabrication 2244 can be collectively referred to as mask data preparation.

In some embodiments, data preparation 2232 includes optical proximity correction (OPC) which uses lithography enhancement techniques to compensate for image errors, such as those that can arise from diffraction, interference, other process effects and the like. OPC adjusts IC design layout diagram 2222. In some embodiments, data preparation 2232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 2232 includes a mask rule checker (MRC) that checks the IC design layout diagram 2222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 2222 to compensate for limitations during mask fabrication 2244, which may undo part of the modifications performed by OPC in order to meet mask creation rules.

In some embodiments, data preparation 2232 includes lithography process checking (LPC) that simulates processing that will be implemented by IC fab 2250 to fabricate IC device 2260. LPC simulates this processing based on IC design layout diagram 2222 to create a simulated manufactured device, such as IC device 2260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 2222.

It should be understood that the above description of data preparation 2232 has been simplified for the purposes of clarity. In some embodiments, data preparation 2232 includes additional features such as a logic operation (LOP) to modify the IC design layout diagram 2222 according to manufacturing rules. Additionally, the processes applied to IC design layout diagram 2222 during data preparation 2232 may be executed in a variety of different orders.

After data preparation 2232 and during mask fabrication 2244, a mask 2245 or a group of masks 2245 are fabricated based on the modified IC design layout diagram 2222. In some embodiments, mask fabrication 2244 includes performing one or more lithographic exposures based on IC design layout diagram 2222. In some embodiments, an electron-beam (e-beam) or a mechanism of multiple e-beams is used to form a pattern on a mask (photomask or reticle) 2245 based on the modified IC design layout diagram 2222. Mask 2245 can be formed in various technologies. In some embodiments, mask 2245 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 2245 includes a transparent substrate (for example, fused quartz) and an opaque material (for example, chromium) coated in the opaque regions of the binary mask. In another example, mask 2245 is formed using a phase shift technology. In a phase shift mask (PSM) version of mask 2245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 2244 is used in a variety of processes. For example, such a mask(s) is used in an ion implantation process to form various doped regions in semiconductor wafer 2253, in an etching process to form various etching regions in semiconductor wafer 2253, and/or in other suitable processes.

IC fab 2250 includes wafer fabrication 2252. IC fab 2250 is an IC fabrication business that includes one or more manufacturing facilities for the fabrication of a variety of different IC products. In some embodiments, IC Fab 2250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 2250 uses mask(s) 2245 fabricated by mask house 2230 to fabricate IC device 2260. Thus, IC fab 2250 at least indirectly uses IC design layout diagram 2222 to fabricate IC device 2260. In some embodiments, semiconductor wafer 2253 is fabricated by IC fab 2250 using mask(s) 2245 to form IC device 2260. In some embodiments, the IC fabrication includes performing one or more lithographic exposures based at least indirectly on IC design layout diagram 2222. Semiconductor wafer 2253 includes a silicon substrate or other proper substrate having material layers formed thereon. Semiconductor wafer 2253 further includes one or more of various doped regions, dielectric features, multilevel interconnects, and the like (formed at subsequent manufacturing steps).

As described above, a semiconductor device of the present disclosure provides a conductive trace coupling between the components in CFET structure. By implementing the conductive trace, better internal routability and better area utility in CFET structure are achieved.

In some embodiments, a semiconductor device is disclosed, including a first transistor disposed over a substrate, a second transistor disposed over the first transistor, and a conductive trace. The first transistor includes a first active area extending on a first layer. The second transistor includes a second active area extending on a second layer above the first layer. The conductive trace extends on a third layer. The first to third layers are separated from each other in a first direction, and the third layer is interposed between the first and second layers. The first active area, the second active area, and the conductive trace overlap in a layout view. In some embodiments, the first transistor further includes a first conductive segment on the first active area, and the second transistor further includes a second conductive segment on the second active area. The second conductive segment is disposed above the first conductive segment. The conductive trace is configured to couple the first conductive segment to the second conductive segment. In some embodiments, the conductive trace and the first and second conductive segments include substantially the same material. In some embodiments, the first transistor further includes a plurality of conductive segments on the first active area. The conductive trace is configured to couple the plurality of conductive segments together. The conductive trace and the plurality of conductive segments overlap in the layout view. In some embodiments, the semiconductor device further includes a gate shared by the first and second transistors, in which the gate extends in the first direction. The first transistor further includes at least one first conductive segment and/or the second transistor further includes at least one second conductive segment. The conductive trace is configured to couple the gate to the at least one first conductive segment and/or the at least one second conductive segment. In some embodiments, the semiconductor device further includes a plurality of gates that extend in the first direction and are separated from each other in a second direction different from the first direction. The first and second transistors share the plurality of gates, and the conductive trace couple the plurality of gates to each other. In some embodiments, the first transistor further includes a first gate, and the second transistor further includes a second gate, in which the first and second gates are separated from each other in the first direction. The conductive trace extends in a second direction different from the first direction, and is arranged interposed between the first and second gates. In some embodiments, the semiconductor device further includes a third transistor disposed over a substrate and separated from the first transistor in a second direction; and a fourth transistor disposed over the third transistor. The first and second transistors share a first gate and the third and fourth transistors share a second gate. The conductive trace is configured to couple the first gate to the second gate, and the conductive trace includes first and second portions extending in the second direction and a third portion extending in a third direction different from the first and second directions.

Also disclosed is a semiconductor device that includes a first active area and a second active area, a first conductive segment, and a conductive trace. The first active area and the second active area extend in a first direction and are separated from each other in a second direction different from the first direction, in which the first active area is disposed over a substrate. The first conductive segment is disposed on the first active area and a second conductive segment is disposed on the second active area. The conductive trace is interposed between the second conductive segment and the substrate. The first conductive segment, the second conductive segment, and the conductive trace overlap with each other in a layout view. In some embodiments, the first active area and the conductive trace overlap in the layout view. In some embodiments, the conductive trace is configured to couple the first conductive segment to the second conductive segment. In some embodiments, the second conductive segment have a first portion extending in the second direction and a second portion extending in a third direction. The first portion of the second conductive segment is coupled to the conductive trace, and the second portion of the second conductive segment is coupled to the second active area. In some embodiments, the semiconductor device further includes a gate extending in the second direction and crossing the first and second active areas. The first and second conductive segments are disposed on the opposite sides of the gate, and the first conductive segment or the second conductive segment extends in the second direction. The conductive trace crossing the gate is configured to couple to gate to the extending first conductive segment or the extending second conductive segment. In some embodiments, the semiconductor device further includes a first gate crossing the first active area and a second gate crossing the second active area. The first and second gates are separated from each other in the second direction; and a third conductive segment disposed on the first active area or the second active area. The conductive trace is interposed between the first and second gates and to couple the third conductive segment to the first conductive segment or the second conductive segment. In some embodiments, the semiconductor device further includes a first gate and a second gate that cross the first active area and are separated from each other in the first direction; and a third gate and a fourth gate that cross the second active area and are separated from each other in the first direction, in which the third and fourth gates are disposed above the first and second gate respectively. The first to fourth gates and the conductive trace overlap in the layout view. In some embodiments, the semiconductor device further includes a gate crossing the first and second active areas; a third active area and a fourth active area above the third active area, in which the third and fourth active areas extend in the first direction, and the third active area is separated from the first active area in a third direction different from the first and second direction; and a third conductive segment disposed on the third active area. The conductive trace is configured to couple the gate to the third conductive segment. The conductive trace has first and third portions extending in the third direction and a second portion extending in a fourth direction different from the third direction. In some embodiments, the first and second conductive segments are L-shaped and coupled to the conductive trace arranged below the first conductive segment.

Also disclosed is a method having operations like: forming a first transistor; forming a second transistor disposed above the first transistor; forming at least one gate shared by the first and second transistors as gates thereof; and forming a conductive trace, in which the conductive trace is disposed between the first and second transistors. In some embodiments, the method further includes forming a plurality of conductive segments included in the first transistor. The plurality of conductive segments are arranged below the conductive trace. In some embodiments, the first transistor and the second transistor are arranged in a first vertical plan. The method further includes forming a third transistor and a fourth transistor above the third transistor, in which the conductive trace is arranged below the fourth transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a first transistor disposed over a substrate, wherein the first transistor comprises a first active area extending on a first layer;

a second transistor disposed over the first transistor, wherein the second transistor comprises a second active area extending on a second layer above the first layer; and a conductive trace extending on a third layer, wherein the first to third layers are separated from each other in a first direction, and the third layer is interposed between the first and second layers;

wherein the first active area, the second active area, and the conductive trace overlap in a layout view.

2. The semiconductor device of claim 1, wherein the first transistor further comprises a first conductive segment on the first active area, and the second transistor further comprises a second conductive segment on the second active area, wherein the second conductive segment is disposed above the first conductive segment;

wherein the conductive trace is configured to couple the first conductive segment to the second conductive segment.

3. The semiconductor device of claim 2, wherein the conductive trace and the first and second conductive segments include substantially the same material.

4. The semiconductor device of claim 1, wherein the first transistor further comprises:

a plurality of conductive segments on the first active area;

wherein the conductive trace is configured to couple the plurality of conductive segments together;

wherein the conductive trace and the plurality of conductive segments overlap in the layout view.

5. The semiconductor device of claim 1, further comprising:

a gate shared by the first and second transistors, wherein the gate extends in the first direction;

wherein the first transistor further comprises at least one first conductive segment and/or the second transistor further comprises at least one second conductive segment;

wherein the conductive trace is configured to couple the gate to the at least one first conductive segment and/or the at least one second conductive segment.

6. The semiconductor device of claim 1, further comprising:

a plurality of gates that extend in the first direction and are separated from each other in a second direction different from the first direction;

wherein the first and second transistors share the plurality of gates, and the conductive trace couple the plurality of gates to each other.

7. The semiconductor device of claim 1, wherein the first transistor further comprises a first gate, and the second transistor further comprises a second gate, wherein the first and second gates are separated from each other in the first direction;

wherein the conductive trace extends in a second direction different from the first direction, and is arranged interposed between the first and second gates.

8. The semiconductor device of claim 1, further comprising:

a third transistor disposed over the substrate and separated from the first transistor in a second direction; and a fourth transistor disposed over the third transistor;

wherein the first and second transistors share a first gate and the third and fourth transistors share a second gate;

wherein the conductive trace is configured to couple the first gate to the second gate, and the conductive trace comprises first and second portions extending in the second direction and a third portion extending in a third direction different from the first and second directions.

9. A semiconductor device, comprising:

a first active area and a second active area that extend in a first direction and are separated from each other in a second direction different from the first direction, wherein the first active area is disposed over a substrate;

a first conductive segment disposed on the first active area and a second conductive segment disposed on the second active area, wherein a surface of the first conductive segment is in contact with a surface of the first active area, and a surface of the second conductive segment is in contact with a surface of the second active area; and a conductive trace that is interposed between the second conductive segment and the substrate and extends in the first direction, wherein the first conductive segment, the second conductive segment, and the conductive trace overlap with each other in a layout view.

10. The semiconductor device of claim 9, wherein the first active area and the conductive trace overlap with each other in the layout view.

11. The semiconductor device of claim 9, wherein the conductive trace is configured to couple the first conductive segment to the second conductive segment.

12. The semiconductor device of claim 11, wherein the second conductive segment includes a first portion extending in the second direction and a second portion extending in a third direction;

wherein the first portion of the second conductive segment is coupled to the conductive trace, and the second portion of the second conductive segment is coupled to the second active area.

13. The semiconductor device of claim 9, further comprising:

a gate extending in the second direction and crossing the first and second active areas;

wherein the first and second conductive segments are disposed on the opposite sides of the gate, and the first conductive segment or the second conductive segment extends in the second direction;

wherein the conductive trace crossing the gate is configured to couple the gate to the extending first conductive segment or the extending second conductive segment.

14. The semiconductor device of claim 9, further comprising:

a first gate crossing the first active area and a second gate crossing the second active area, wherein the first and second gates are separated from each other in the second direction; and a third conductive segment disposed on the first active area or the second active area;

wherein the conductive trace is interposed between the first and second gates and to couple the third conductive segment to the first conductive segment or the second conductive segment.

15. The semiconductor device of claim 9, further comprising:

a first gate and a second gate that cross the first active area and are separated from each other in the first direction; and a third gate and a fourth gate that cross the second active area and are separated from each other in the first direction, wherein the third and fourth gates are disposed above the first and second gates respectively;

wherein the first to fourth gates and the conductive trace overlap in the layout view.

16. The semiconductor device of claim 9, further comprising:
   a gate crossing the first and second active areas;
   a third active area and a fourth active area above the third active area, wherein the third and fourth active areas extend in the first direction, and the third active area is separated from the first active area in a third direction different from the first and second direction; and
   a third conductive segment disposed on the third active area;
   wherein the conductive trace is configured to couple the gate to the third conductive segment;
   wherein the conductive trace has first and third portions extending in the third direction and a second portion extending in a fourth direction different from the third direction.

17. The semiconductor device of claim 9, wherein the first and second conductive segments are L-shaped and coupled to the conductive trace arranged below the first conductive segment.

18. A method, comprising:
   forming a first transistor in a first layer;
   forming a second transistor in a second layer disposed above the first transistor, wherein active areas of the first and second transistors overlap with each other in a layout view;
   forming at least one gate shared by the first and second transistors as gates thereof;
   forming a conductive trace in a third layer interposed between the first and second layers, wherein the conductive trace is disposed between the first and second transistors and passes through the at least one gate; and
   forming a plurality of conductive segments included in the first transistor;
   wherein the plurality of conductive segments are arranged below the conductive trace.

19. The method of claim 18, wherein the first transistor and the second transistor are arranged in a first vertical plan; wherein the method further comprises:
   forming a third transistor and a fourth transistor above the third transistor, wherein the third and fourth transistors are arranged in a second vertical plan parallel to the first vertical plan;
   wherein the conductive trace is arranged below the fourth transistor.

20. The method of claim 18, further comprising:
   forming a third transistor in the first layer and forming a fourth transistor in the second layer, wherein the third and fourth transistors overlap with each other in the layout view, and
   the conductive trace is arranged between the third and fourth transistors.

* * * * *